(12) United States Patent
Kwon

(10) Patent No.: US 11,075,138 B2
(45) Date of Patent: Jul. 27, 2021

(54) SEMICONDUCTOR PACKAGE SYSTEM

(71) Applicant: Samsung Electronics Co., Ltd., Suwon-si (KR)

(72) Inventor: Heungkyu Kwon, Seongnam-si (KR)

(73) Assignee: Samsung Electronics Co., Ltd., Gyeonggi- do (KR)

( * ) Notice: Subject to any disclaimer, the term of this patent is extended or adjusted under 35 U.S.C. 154(b) by 0 days.

(21) Appl. No.: 16/397,278

(22) Filed: Apr. 29, 2019

(65) Prior Publication Data

US 2019/0348343 A1 Nov. 14, 2019

(30) Foreign Application Priority Data

May 11, 2018 (KR) .................. 10-2018-0054304
May 11, 2018 (KR) .................. 10-2018-0054305
(Continued)

(51) Int. Cl.
H01L 23/373 (2006.01)
H01L 23/31 (2006.01)
(Continued)

(52) U.S. Cl.
CPC ...... *H01L 23/3735* (2013.01); *H01L 23/3107* (2013.01); *H01L 23/367* (2013.01);
(Continued)

(58) Field of Classification Search
None
See application file for complete search history.

(56) References Cited

U.S. PATENT DOCUMENTS 6,222,259 B1 4/2001 Park et al.
6,251,709 B1 6/2001 Yoshikawa
(Continued)

FOREIGN PATENT DOCUMENTS

CN 105789154 A 7/2016
CN 105789191 A 7/2016
(Continued)

OTHER PUBLICATIONS

W.A. Wohlmuth et al., 'E-/D-pHEMT technology for wireless components' *IEEE Compound Semiconductor Integrated Circuit Symposium*, 2004.
(Continued)

*Primary Examiner* — Dung A. Le
(74) *Attorney, Agent, or Firm* — Harness, Dickey & Pierce, P.L.C.

(57) ABSTRACT

Provided is a semiconductor package system. The system includes a substrate, a first semiconductor package on the substrate, a second semiconductor package on the substrate, a first passive element on the substrate, a heat dissipation structure on the first semiconductor package, the second semiconductor package, and the first passive element, and a first heat conduction layer between the first semiconductor package and the heat dissipation structure. A sum of a height of the first semiconductor package and a thickness of the first heat conduction layer may be greater than a height of the first passive element. The height of the first semiconductor package may be greater than a height of the second semiconductor package.

20 Claims, 21 Drawing Sheets

(30) Foreign Application Priority Data

| | | | |
|---|---|---|---|
| May 11, 2018 | (KR) | ................ | 10-2018-0054307 |
| May 14, 2018 | (KR) | ................ | 10-2018-0055081 |
| Sep. 14, 2018 | (KR) | ................ | 10-2018-0110511 |

(51) Int. Cl.
  *H01L 23/367* (2006.01)
  *H01L 23/00* (2006.01)

(52) U.S. Cl.
  CPC .............. *H01L 24/09* (2013.01); *H01L 24/17* (2013.01); *H01L 24/33* (2013.01)

(56) References Cited

U.S. PATENT DOCUMENTS

| | | | |
|---|---|---|---|
| 6,867,502 B2 | 3/2005 | Katagiri et al. | |
| 7,141,819 B2 | 11/2006 | Maruko | |
| 7,250,676 B2 | 7/2007 | Wang | |
| 7,687,803 B2 | 3/2010 | Takagi et al. | |
| 7,745,915 B2 | 6/2010 | Suwa et al. | |
| 8,541,876 B2 | 9/2013 | Lu et al. | |
| 8,754,517 B2 | 6/2014 | Kim et al. | |
| 8,780,561 B2* | 7/2014 | Danello | H01L 23/433 361/706 |
| 8,981,554 B2 | 3/2015 | Kim | |
| 9,443,785 B2* | 9/2016 | Yu | H01L 23/3107 |
| 9,460,982 B2 | 10/2016 | Kourakata et al. | |
| 9,595,506 B2 | 3/2017 | Chen et al. | |
| 9,595,514 B2 | 3/2017 | Bruno et al. | |
| 9,735,082 B2 | 8/2017 | Hung et al. | |
| 10,580,717 B2* | 3/2020 | Liu | H01L 25/18 |
| 2002/0121683 A1 | 9/2002 | Kelly et al. | |
| 2005/0189634 A1 | 9/2005 | Wakiyama et al. | |
| 2008/0054261 A1 | 3/2008 | Song et al. | |
| 2008/0105964 A1 | 5/2008 | Iwamura et al. | |
| 2008/0128897 A1* | 6/2008 | Chao | H01L 23/10 257/713 |
| 2009/0065773 A1 | 3/2009 | Ishikawa et al. | |
| 2009/0115044 A1 | 5/2009 | Hoshino et al. | |
| 2012/0051017 A1 | 3/2012 | Lee et al. | |
| 2014/0264821 A1* | 9/2014 | Tang | H01L 23/367 257/713 |
| 2014/0284764 A1 | 9/2014 | Lee | |
| 2015/0069635 A1 | 3/2015 | Kim et al. | |
| 2015/0130041 A1 | 5/2015 | Seo et al. | |
| 2015/0162307 A1* | 6/2015 | Chen | H01L 23/3672 257/712 |
| 2016/0120039 A1 | 4/2016 | Bang et al. | |
| 2016/0233141 A1* | 8/2016 | Hirobe | H01L 24/17 |
| 2016/0320426 A1 | 11/2016 | Boysel et al. | |
| 2017/0092619 A1* | 3/2017 | Refai-Ahmed | H01L 24/00 |
| 2017/0141095 A1 | 5/2017 | Bruno et al. | |
| 2017/0170147 A1 | 6/2017 | Goh et al. | |
| 2018/0090411 A1* | 3/2018 | Cetegen | H01L 24/29 |
| 2020/0105684 A1* | 4/2020 | Chang | H01L 23/3128 |

FOREIGN PATENT DOCUMENTS

| | | |
|---|---|---|
| JP | H06177320 A | 6/1994 |
| JP | H06224334 A | 8/1994 |
| JP | 2003-264256 A | 9/2003 |
| JP | 3573135 | 9/2003 |
| JP | 2004-022664 A | 1/2004 |
| JP | 2004228162 A | 8/2004 |
| JP | 3811467 A | 12/2004 |
| JP | 2006-237385 A | 9/2006 |
| JP | 2006-278374 A | 10/2006 |
| JP | 2006-344824 A | 12/2006 |
| JP | 2008-124080 A | 5/2008 |
| JP | 2008-277362 A | 11/2008 |
| JP | 2008-305835 A | 12/2008 |
| JP | 2009-049170 A | 3/2009 |
| JP | 2009-070965 A | 4/2009 |
| JP | 5246133 A | 5/2011 |
| JP | 2014-154688 A | 8/2014 |
| KR | 20-2000-0019563 U | 11/2000 |
| KR | 10-2003-0074158 A | 9/2003 |
| KR | 10-2006-0094917 A | 8/2006 |
| KR | 10-0853136 A | 12/2006 |
| KR | 10-0843202 A | 3/2008 |
| KR | 10-2008-0041999 A | 5/2008 |
| KR | 10-2009-0027573 A | 3/2009 |
| KR | 10-2016-0091084 A | 8/2016 |
| WO | WO-99/16128 A1 | 4/1999 |
| WO | WO-2017095385 A1 | 6/2017 |

OTHER PUBLICATIONS

Extended European Search Report dated Oct. 8, 2019, dated in corresponding U.S Application No. 19172606.6.

* cited by examiner

SEMICONDUCTOR PACKAGE SYSTEM

CROSS-REFERENCE TO RELATED APPLICATIONS

This U.S. non-provisional patent application claims priority under 35 U.S.C. § 119 of Korean Patent Application Nos. 10-2018-0054304, filed on May 11, 2018; 10-2018-0054305, filed on May 11, 2018; 10-2018-0054307, filed on May 11, 2018; 10-2018-0055081, filed on May 14, 2018; and 10-2018-0110511, filed on Sep. 14, 2018, the entire contents of each of which are hereby incorporated by reference.

BACKGROUND

The present disclosure herein relates to a semiconductor package system, and more particularly to a semiconductor package system having a heat dissipation structure.

The semiconductor package is implemented in a form suitable for use in an electronic product. Generally, semiconductor packages are generally mounted with a semiconductor chip on a printed circuit board (PCB) and electrically connected to each other using bonding wires or bumps. As the semiconductor package is increased in speed and capacity, the power consumption of the semiconductor package is increasing. Accordingly, the thermal characteristics of the semiconductor package become more important.

SUMMARY

Inventive concepts relate to a semiconductor package having improved thermal characteristics and a semiconductor module including the same.

According to an embodiment of inventive concepts, a semiconductor package system may include a substrate; a first semiconductor package on the substrate; a second semiconductor package on the substrate; a first passive element on the substrate; a heat dissipation structure provided on the first semiconductor package, the second semiconductor package, and the first passive element; and a first heat conduction layer between the first semiconductor package and the heat dissipation structure. A sum of a height of the first semiconductor package and a thickness of the first heat conduction layer may be greater than a height of the first passive element. The height of the first semiconductor package may be greater than a height of the second semiconductor package.

In an embodiment of inventive concepts, a semiconductor package system may include a substrate; a first semiconductor package on an upper surface of the substrate, and the first semiconductor package including a first semiconductor chip, the first semiconductor chip including one or more logic circuits; a second semiconductor package on the upper surface of the substrate; a passive element on the upper surface of the substrate; a heat dissipation structure on the first semiconductor package, the second semiconductor package, and the passive element; and a plurality of heat conduction layers that are each in physical contact with a lower surface of the heat dissipation structure. The plurality of heat conduction layers may include a first heat conduction layer on an upper surface of the first semiconductor package, and the first heat conduction layer may have a thinnest thickness among the plurality of heat conduction layers.

In an embodiment of inventive concepts, a semiconductor package system may include a substrate; a first semiconductor package on the substrate, the first semiconductor package including a first semiconductor chip, the first semiconductor chip including one or more logic circuits; a second semiconductor package on the substrate; a passive element on the substrate; a heat dissipation structure on the first semiconductor package, the second semiconductor package, and the passive element; a first heat conduction layer on the first semiconductor package, the first heat conduction layer in physical contact with the heat dissipation structure; and a second heat conduction layer on the second semiconductor package, the second heat conduction layer in physical contact with the heat dissipation structure. A thickness of the first heat conduction layer may be a smaller than a thickness of the second heat conduction layer. An upper surface of the first heat conduction layer may be provided at a level higher than an upper surface of the passive element.

BRIEF DESCRIPTION OF THE FIGURES

The accompanying drawings are included to provide a further understanding of inventive concepts, and are incorporated in and constitute a part of this specification. The drawings illustrate example embodiments of inventive concepts and, together with the description, serve to explain principles of inventive concepts. In the drawings.

DETAILED DESCRIPTION

Figure 1A:
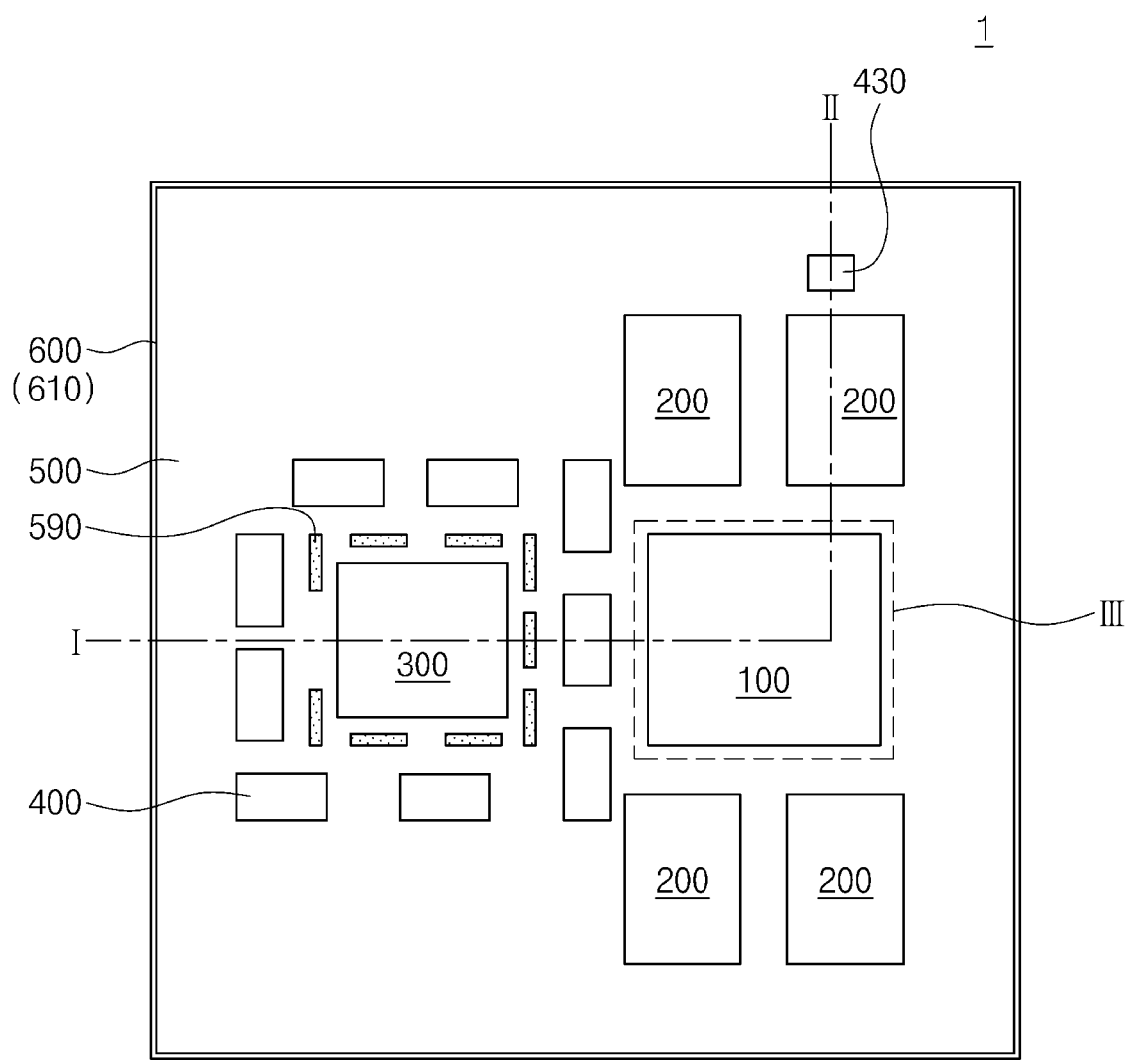
FIG. 1A is a plan view showing a package system according to example embodiments.

In this specification, like reference numerals refer to like components throughout the specification. Hereinafter, a package system according to inventive concepts and a semiconductor module including the same will be described. The semiconductor package system may be a package system or a semiconductor module including the package system.

Figure 1B:
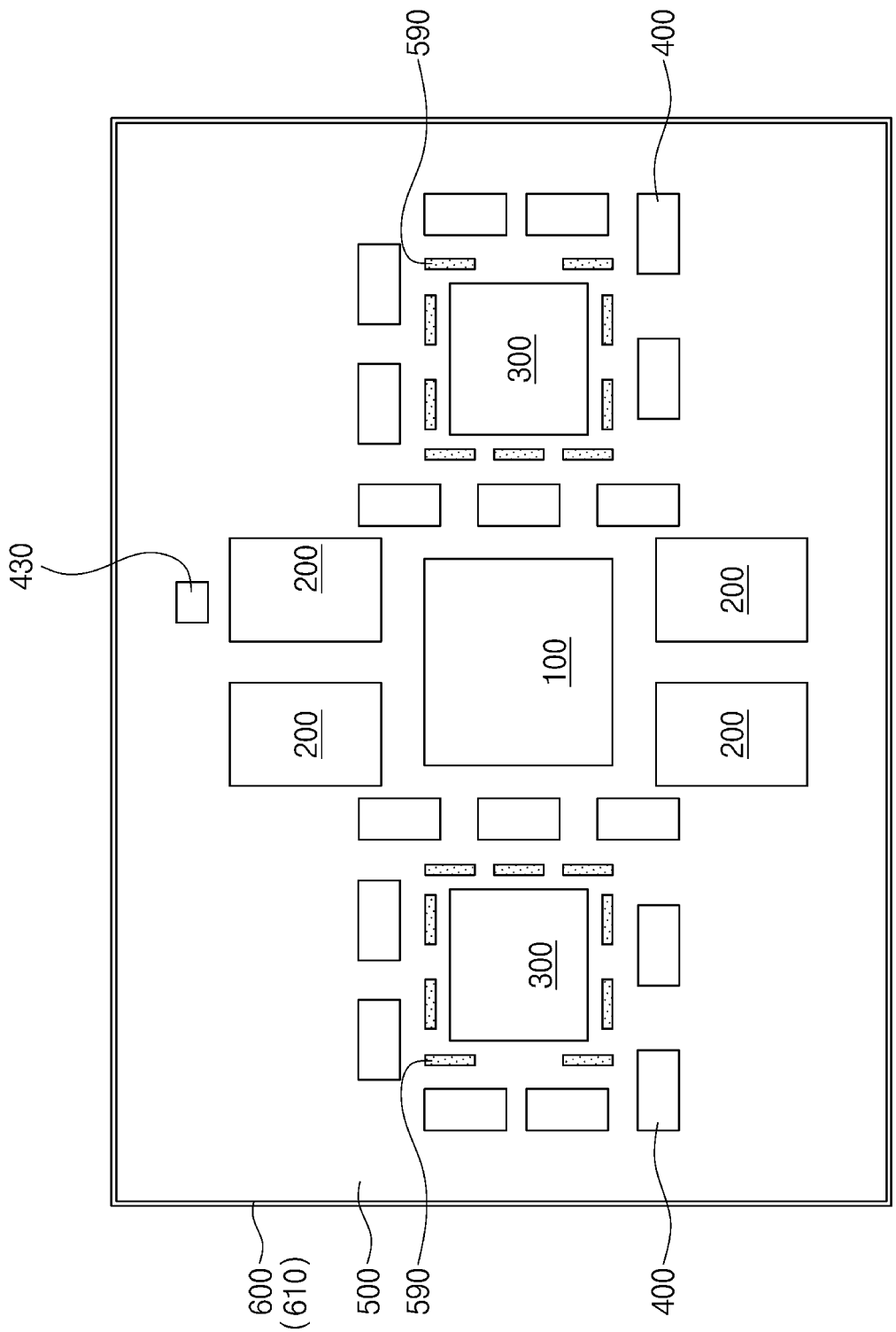
FIG. 1B is a plan view showing a package system according to example embodiments.
Figure 1C:
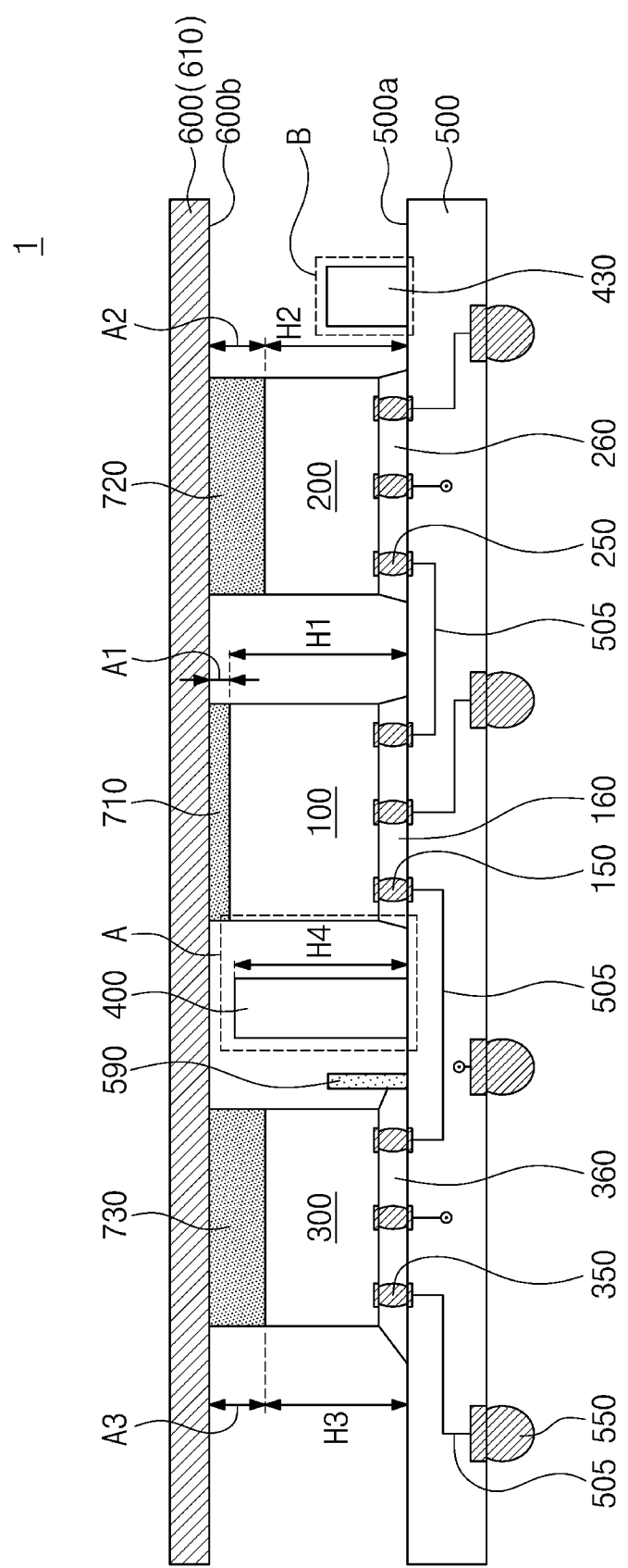
FIG. 1C is a cross-sectional view taken along the line I-II of FIG. 1A.
Figure 1D:
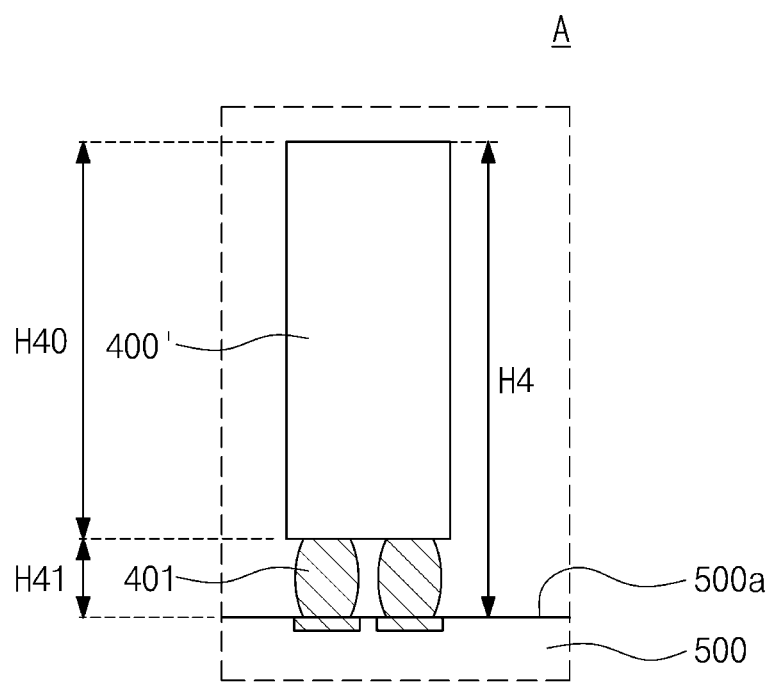
FIG. 1D is an enlarged view of the region A of FIG. 1C.
Figure 1E:
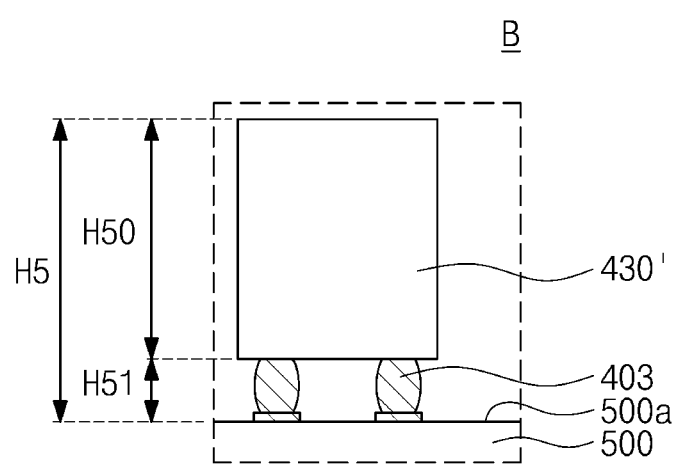
FIG. 1E is an enlarged view of the region B of FIG. 1C.

FIG. 1A is a plan view showing a package system according to example embodiments. FIG. 1B is a plan view showing a package system according to example embodiments. FIG. 1C is a cross-sectional view taken along the line I-II of FIG. 1A. FIG. 1D is an enlarged view of the region A of FIG. 1C. FIG. 1E is an enlarged view of the region B of FIG. 1C.

Referring to FIGS. 1A, 1B, 1C, 1D, and 1E, a package system 1 includes a substrate 500, a first semiconductor package 100, a second semiconductor package 200, a third semiconductor package 300, a first passive element 400, a heat dissipation structure 600, and a first heat conduction layer 710. As an example, a printed circuit board (PCB) having a circuit pattern may be used as a substrate 500. Conductive terminals 550 may be provided on the lower surface of the substrate 500. The conductive terminals 550 may include at least one of solder balls, bumps, and pillars. The conductive terminals 550 may include, for example, a metal.

The first semiconductor package 100 may be mounted on the upper surface 500a of the substrate 500. The first semiconductor package 100 may include a logic chip or a system-on-chip, as described later. The first connection terminals 150 may be interposed between the substrate 500 and the first semiconductor package 100. The first semiconductor package 100 may be electrically connected to the substrate 500 through the first connection terminals 150. In this specification, the electrical connection with the substrate 500 may mean that it is electrically connected with the interconnections 505 in the substrate 500. The first connection terminals 150 may include a solder ball, a pillar, a bump, or a ball grid array. The height H1 of the mounted first semiconductor package 100 may be defined as including the height of the first connection terminals 150. In this specification, the height of any component may mean the maximum distance of the component measured in a direction perpendicular to the upper surface 500a of the substrate 500. The pitch of the first connection terminals 150 may be smaller than the pitch of the conductive terminals 550.

The second semiconductor package 200 may be mounted on the upper surface 500a of the substrate 500. The second semiconductor package 200 may be spaced apart from the first semiconductor package 100 in plan view. The second semiconductor package 200 may be a semiconductor package different type from the first semiconductor package 100. The second connection terminals 250 may be interposed between the substrate 500 and the second semiconductor package 200. The second semiconductor package 200 may be electrically connected to the substrate 500 through the second connection terminals 250. The second connection terminals 250 may include a solder ball, a pillar, a bump, or a ball grid array. The pitch of the second connection terminals 250 may be smaller than the pitch of the conductive terminals 550. The height H2 of the mounted second semiconductor package 200 may be defined as including the height of the second connection terminals 250. The second semiconductor package 200 may be provided in plurality. The second semiconductor packages 200 may be spaced apart from each other. However, the number and the planar arrangement of the second semiconductor packages 200 may be variously modified.

The third semiconductor package 300 may be mounted on the substrate 500. The third semiconductor package 300 may be spaced apart from the first semiconductor package 100 and the second semiconductor package 200 in plan view. The third semiconductor package 300 may be a semiconductor package different type from the first and second semiconductor packages 100 and 200. The third semiconductor package 300 may be provided in single as shown in FIG. 1A. As another example, the third semiconductor package 300 may be provided in plurality as shown in FIG. 1B. In this case, the third semiconductor packages 300 may be spaced apart from each other. The number and planar arrangement of the third semiconductor packages 300 may be variously modified without being limited to those shown in FIGS. 1A and 1B. Hereinafter, the third semiconductor package 300 in single will be described. The third connection terminals 350 may be interposed between the substrate 500 and the third semiconductor package 300 as shown in FIG. 1C. The third semiconductor package 300 may be electrically connected to the substrate 500 through the third connection terminals 350. The third connection terminals 350 may include a solder ball, a pillar, a bump, or a ball grid array. The pitch of the third connection terminals 350 may be smaller than the pitch of the conductive terminals 550. The height H3 of the mounted third semiconductor package 300 may be defined as including the height of the third connection terminals 350. The height H1 of the mounted first semiconductor package 100 may be greater than the height H3 of the mounted third semiconductor package 300.

The first passive element 400 may be mounted on the upper surface 500a of the substrate 500. The first passive element 400 may be spaced apart from the first, second, and third semiconductor packages 100, 200, and 300 in plan view. The first passive element 400 may include any one of an inductor, a resistor, and a capacitor. The first connection terminal portions 401 may be further provided between the substrate 500 and the first passive element 400 as shown in FIG. 1D. The first connection terminal portions 401 may include, for example, a solder, a pillar, a bump, or a ball grid array. The height H4 of the mounted first passive element 400 may be defined as including the height of the first connection terminal portions 401. For example, the height H4 of the first passive element 400 may be equal to the sum of the height H41 of the first connection terminal portions 401 and the height H40 of the first passive element 400' before being mounted. The height H4 of the mounted first passive element 400 may be substantially equal to the distance between the upper surface 500a of the substrate 500 and the uppermost surface of the first passive element 400. The first passive element 400 may be provided in plurality. As shown in FIGS. 1A and 1B, the first passive elements 400 may be spaced apart from each other. The number and the planar arrangement of the first passive elements 400 may be variously modified. Hereinafter, the single first passive element 400 will be described. In the drawings other than FIG.

1D, the first connection terminal portions 401 are omitted for simplification, but inventive concepts are not limited thereto.

A heat dissipation structure 600 may be provided on the first to third semiconductor packages 100, 200, 300 and the first passive element 400. The lower surface 600b of the heat dissipation structure 600 may face the first, second, and third semiconductor packages 100, 200, and 300. The lower surface 600b of the heat dissipation structure 600 may be substantially flat. For example, the lower surface 600b of the heat dissipation structure 600 on the first semiconductor package 100, the lower surface 600b of the heat dissipation structure 600 above on the second semiconductor package 200, the lower surface 600b on the third semiconductor package 300, and the lower surface 600b of the heat dissipation structure 600 above on the first passive element 400 may be disposed at substantially the same level. The additional processing on the lower surface 600b of the heat dissipation structure 600 is omitted, so that the manufacture of the heat dissipation structure 600 may be simplified. The processing may include forming a trench or forming a protrusion. The heat dissipation structure 600 may include a thermally conductive material. The thermally conductive material may include a metal (e.g., copper and/or aluminum) or a carbon containing material (e.g., graphene, graphite, and/or carbon nanotubes). The heat dissipation structure 600 may have a relatively high thermal conductivity. As an example, a single metal layer or a plurality of stacked metal layers may be used as the heat dissipation structure 600. As another example, the heat dissipation structure 600 may include a heat sink or a heatpipe. As another example, the heat dissipation structure 600 may use a water cooling method. The heat dissipation structure 600 may include a first heat dissipation structure 610. The first heat dissipation structure 610 may be spaced apart from the substrate 500.

The first heat conduction layer 710 may be interposed between the first semiconductor package 100 and the heat dissipation structure 600. The first heat conduction layer 710 may be in physical contact with the upper surface of the first semiconductor package 100 and the lower surface 600b of the heat dissipation structure 600. The first heat conduction layer 710 may include a thermal interface material (TIM). The thermal interface material may include, for example, polymers and thermally conductive particles. The thermally conductive particles may be dispersed within the polymer. During an operation of the first semiconductor package 100, heat generated from the first semiconductor package 100 may be transferred to the heat dissipation structure 600 through the first heat conduction layer 710.

According to example embodiments, the sum of the height H1 of the mounted first semiconductor package 100 and the thickness A1 of the first heat conduction layer 710 may be greater than the height H4 of the mounted first passive element 400. Even if the first passive element 400 is provided on the upper surface 500a of the substrate 500, the first heat conduction layer 710 may be in physical contact with the first semiconductor package 100 and the heat dissipation structure 600.

The second heat conduction layer 720 may be provided between the second semiconductor package 200 and the heat dissipation structure 600. The second heat conduction layer 720 may be in physical contact with the upper surface of the second semiconductor package 200 and the lower surface 600b of the heat dissipation structure 600. The second heat conduction layer 720, for example, may include a thermal interface material. During an operation of the second semiconductor package 200, heat generated from the second semiconductor package 200 may be transferred to the heat dissipation structure 600 through the second heat conduction layer 720.

The third heat conduction layer 730 may be provided between the third semiconductor package 300 and the heat dissipation structure 600. The third heat conduction layer 730 may be in physical contact with the upper surface of the third semiconductor package 300 and the lower surface 600b of the heat dissipation structure 600. The third heat conduction layer 730, for example, may include a thermal interface material. During an operation of the third semiconductor package 300, heat generated from the third semiconductor package 300 may be transferred to the third semiconductor package 300 through the third heat conduction layer 730.

During an operation of the package system 1, a lot of heat may be generated from the first semiconductor package 100. For example, the first semiconductor package 100 may generate more heat than those from the second semiconductor package 200, the third semiconductor package 300, and the first passive element 400. The thermal characteristics of the first semiconductor package 100 may have a greater effect on the operating characteristics of the package system 1 than the thermal characteristics of the second and third semiconductor packages 200 and 300. As the thermal characteristics of the first semiconductor package 100 are improved, the operating characteristics of the package system 1 may be improved. Each of the first to third heat conduction layers 710, 720, 730 may have a lower thermal conductivity than that of the heat dissipation structure 600. As the thickness A1 of the first heat conduction layer 710 decreases, the heat generated from the first semiconductor package 100 may be emitted more quickly to the heat dissipation structure 600. According to example embodiments, the thickness A1 of the first heat conduction layer 710 may be the smallest among the thicknesses of the heat conduction layers contacting the lower surface 600b of the heat dissipation structure 600. Here, the heat conduction layers may include first to third heat conduction layers 710, 720, and 730. The heat conduction layers may further include conductive adhesive patterns 741, which will be described later with reference to FIGS. 2A to 2D. The thickness A1 of the first heat conduction layer 710 may be less than the thickness A2 of the second heat conduction layer 720 and the thickness A3 of the third heat conduction layer 730, for example. Accordingly, the heat generated from the first semiconductor package 100 may be transferred to the heat dissipation structure 600 more quickly. The package system 1 may show improved operating characteristics.

An electronic element 430 may further be provided on the upper surface 500a of the substrate 500. The electronic element 430 may include an oscillator such as a crystal oscillator or a real-time clock. As shown in FIG. 1E, a conductive connection terminal 403 may be further provided between the electronic element 430 and the upper surface 500a of the substrate 500 so as to be electrically connected to the electronic element 430 and the substrate 500. The height H5 of the mounted electronic element 430 may be defined as including the height H51 of the conductive connection terminal 403. The height H5 of the mounted electronic element 430 may be equal to the sum of the height H51 of the conductive connection terminal 403 and the height H50 of the electronic element 430' before being mounted. The sum of the height H1 of the mounted first semiconductor package 100 and the thickness A1 of the first heat conduction layer 710 may be greater than the height H5 of the mounted electronic element 430. Although the electronic element 430 is provided on the upper surface 500a of the substrate 500, the heat generated from the first semiconductor package 100 may be smoothly discharged to the heat dissipation structure 600 through the first heat conduction layer 710. As another example, the electronic element 430 may not be provided. In the drawings other than FIG. 1E, the conductive connection terminal 403 is omitted for simplification, but inventive concepts are not limited thereto. Hereinafter, the electrical connection of the semiconductor packages 100, 200, and 300 will be described.

The first semiconductor package 100 is electrically connected to the second semiconductor package 200, the third semiconductor package 300 and the conductive terminals 550 through the interconnections 505 of the substrate 500 as shown in FIG. 1C. The second semiconductor package 200 may be electrically connected to the first semiconductor package 100, the third semiconductor package 300, and the conductive terminals 550 through the interconnections 505 of the substrate 500. The third semiconductor package 300 may be electrically connected to the first semiconductor package 100, the second semiconductor package 200, and the conductive terminals 550 through the interconnections 505 of the substrate 500.

The first underfill film 160 may be provided in the gap between the substrate 500 and the first semiconductor package 100 to seal the first connection terminals 150. A second underfill film 260 may be provided in the gap between the substrate 500 and the second semiconductor package 200 to seal the second connection terminals 250. A third underfill film 360 may be provided in the gap between the substrate 500 and the second semiconductor package 200 to seal the third connection terminals 350. The first to third underfill films 160, 260, and 360 may include an insulating polymer such as an epoxy-based polymer. As the first to third underfill films 160, 260, and 360 are provided, the reliability of bonding of the first to third connection terminals 150, 250, and 350 may be improved. Unlike the illustrated embodiment, at least one of the first to third underfill films 160, 260, and 360 may be omitted.

A dam structure 590 may be further provided on the upper surface 500a of the substrate 500. The dam structure 590 may be disposed between the third semiconductor package 300 and the first passive element 400. The dam structure 590 may be formed by using a liquid resin. Although not shown in the drawing, the substrate 500 may include a plurality of layers, and the uppermost layer of the layers may include an insulating polymer such as a solder resist material. In one example, the dam structure 590 may be formed integrally with the uppermost layer of the substrate 500. In this case, the dam structure 590 may be connected to the uppermost layer of the substrate 500 without an interface. As another example, the dam structure 590 may include a material different form that of substrate 500. For example, the dam structure 590 may be formed of the same material as any one of the first to third underfill films 160, 260, and 360. The height of the dam structure 590 may be equal to or less than the sum of the height H1 of the mounted first semiconductor package 100 and the thickness A1 of the first heat conduction layer 710.

The arrangement and number of the dam structures 590 may be variously modified. For example, the dam structure 590 may be disposed between the first semiconductor package 100 and the first passive element 400. As another example, the dam structure 590 may be disposed between the second semiconductor package 200 and the first passive element 400. The dam structure 590 may be provided in plurality as shown in FIG. 1A. The dam structures 590 may be spaced apart from one another. Hereinafter, each of the first to third semiconductor packages 100, 200, and 300 will be described in more detail.

Figure 1F:
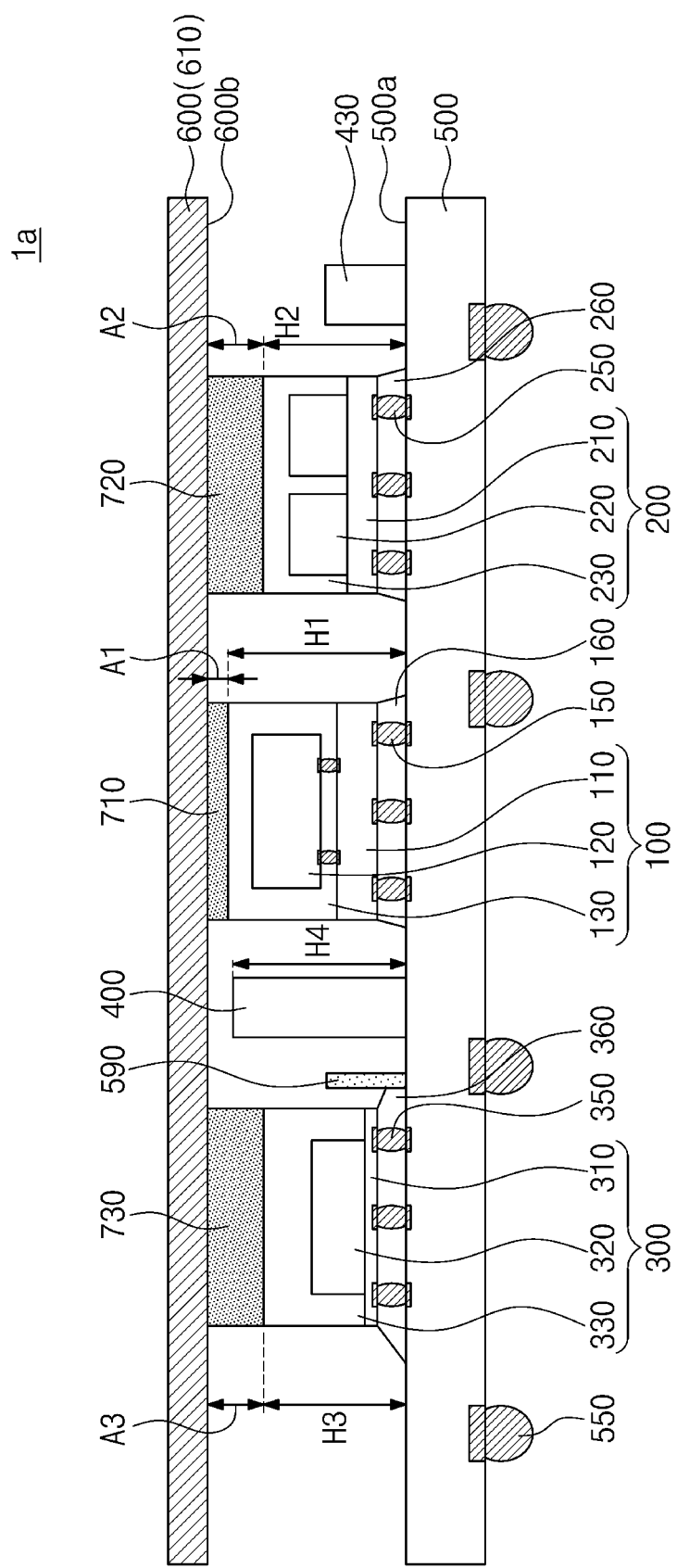
FIG. 1F is a view showing a package system according to example embodiments.

FIG. 1F is a view showing a package system according to example embodiments, corresponding to a cross-section taken along the line I-II of FIG. 1A. Hereinafter, the contents overlapping with those described above will be omitted. In the description of FIG. 1F, FIGS. 1A, 1B, and 1C are described together.

Referring to FIG. 1F, a package system 1a includes a substrate 500, first to third semiconductor packages 100, 200 and 300, a first passive element 400, first to third heat conduction layers 710, 720, and 730, and a heat dissipation structure 600.

The first semiconductor package 100 may include a first substrate 110, a first semiconductor chip 120, and a first molding layer 130. As an example, a printed circuit board (PCB) may be used as the substrate 500. As another example, a redistribution layer may be used as the substrate 500. The first semiconductor chip 120 may be flip-chip mounted on the first substrate 110. Connection portions may be provided between the first semiconductor chip 120 and the first substrate 110. The connection portions may include a solder ball, a pillar, a bump, or a ball grid array. The first semiconductor chip 120 may be a system on chip (SOC), a logic chip, or an application processor (AP) chip. The first semiconductor chip 120 may include circuits having different functions. The first semiconductor chip 120 may include a logic circuit and a memory circuit. The first semiconductor chip 120 may further include at least one of a digital integrated circuit (IC), a wireless radio frequency integrated circuit (RFIC), and an input/output circuit. Generating heat from the first semiconductor package 100 may mean that heat is generated from the first semiconductor chip 120.

The first molding layer 130 may be disposed on the first substrate 110 to cover the first semiconductor chip 120. The first molding layer 130 covers the side surfaces and the upper surface of the first semiconductor chip 120 to seal the first semiconductor chip 120. In this case, the upper surface of the first semiconductor package 100 may correspond to the upper surface of the first molding layer 130. The first molding layer 130 may include an insulating polymer such as an epoxy molding compound. The first molding layer 130 may further extend into the gap between the first substrate 110 and the first semiconductor chip 120. Unlike what is shown, an additional underfill pattern may be filled in the gap between the first substrate 110 and the first semiconductor chip 120. The underfill pattern may be formed by a method of thermal compression of a nonconductive paste or a nonconductive film or by a capillary underfill process. The height H1 of the mounted first semiconductor package 100 is defined as the sum of the height of the first connection terminals 150, the height of the first substrate 110, and the height of the first molding layer 130.

The second semiconductor package 200 may include a second substrate 210, a second semiconductor chip 220, and a second molding layer 230. A printed circuit board (PCB) or redistribution layer may be used as the substrate 500. The second semiconductor chip 220 may be a semiconductor chip different type from the first semiconductor chip 120. For example, the second semiconductor chip 220 may function as a memory chip. The memory chip may include a DRAM chip. As another example, the memory chip may include SRAM, MRAM, and/or NAND flash memory. Generating heat from the second semiconductor package 200 may mean that heat is generated from the second semiconductor chip 220. The second semiconductor chip 220 may be mounted by a flip chip method or a bonding wire method. When the second semiconductor chip 220 is flip-chip mounted, an additional underfill pattern may be filled in the gap between the second substrate 210 and the second semiconductor chip 220. The second semiconductor package 200 may include a plurality of second semiconductor chips 220. As another example, the second semiconductor package 200 may include a single second semiconductor chip 220. The second molding layer 230 covers the side surfaces and the upper surface of the second semiconductor chip 220 to seal the second semiconductor chip 220. In this case, the upper surface of the second semiconductor package 200 may correspond to the upper surface of the second molding layer 230. Unlike what is shown, the second molding layer 230 covers the side surface of the second semiconductor chip 220, and may expose the upper surface of the second semiconductor chip 220. In this case, the upper surface of the second semiconductor package 200 may correspond to the upper surface of the second molding layer 230 and the upper surface of the second semiconductor chip 220 exposed by the second molding layer 230. The second molding layer 230 may include an insulating polymer such as an epoxy-based polymer. The height H2 of the mounted second semiconductor package 200 is defined as the sum of the height of the second connection terminals 250, the height of the second substrate 210, and the height of the second molding layer 230.

The third semiconductor package 300 may include a third substrate 310, a third semiconductor chip 320, and a third molding layer 330. A redistribution layer or a printed circuit board may be used as the third substrate 310. When a redistribution layer is used as the third substrate 310, the third semiconductor package 300 may be fabricated with a fan-out panel level package or a fan-out wafer level package. The third semiconductor chip 320 may be a semiconductor chip different type from the first semiconductor chip 120 and the second semiconductor chip 220. For example, the third semiconductor chip 320 may include a power management integrated circuit (PMIC) to function as a power management chip. Generating heat from the third semiconductor package 300 may mean that heat is generated from the third semiconductor chip 320. The third molding layer 330 may be provided on the third substrate 310 to cover the upper surface and side surfaces of the third semiconductor chip 320. In this case, the upper surface of the third semiconductor package 300 may correspond to the upper surface of the third molding layer 330. Unlike what is shown, the third molding layer 330 covers the side surface of the third semiconductor chip 320, and may expose the upper surface of the third semiconductor chip 320. In this case, the upper surface of the third semiconductor package 300 may correspond to the upper surface of the third molding layer 330 and the upper surface of the third semiconductor chip 320 exposed by the third molding layer 330. The third molding layer 330 may include an insulating polymer such as an epoxy-based polymer. The height H3 of the mounted third semiconductor package 300 is defined as the sum of the height of the third connection terminals 350, the height of the third substrate 310, and the height of the third molding layer 330. The formation of the third semiconductor package 300 may include providing the third semiconductor chip 320 on a carrier substrate, forming the third molding layer 330 covering the third semiconductor chip 320, removing the carrier substrate to expose a lower surface of the third semiconductor chip 320, and forming a redistribution layer on the lower surface of the exposed third semiconductor chip 320 and a lower surface of the molding layer. In this case, the redistribution layer may be a third substrate 310.

Figure 1G:
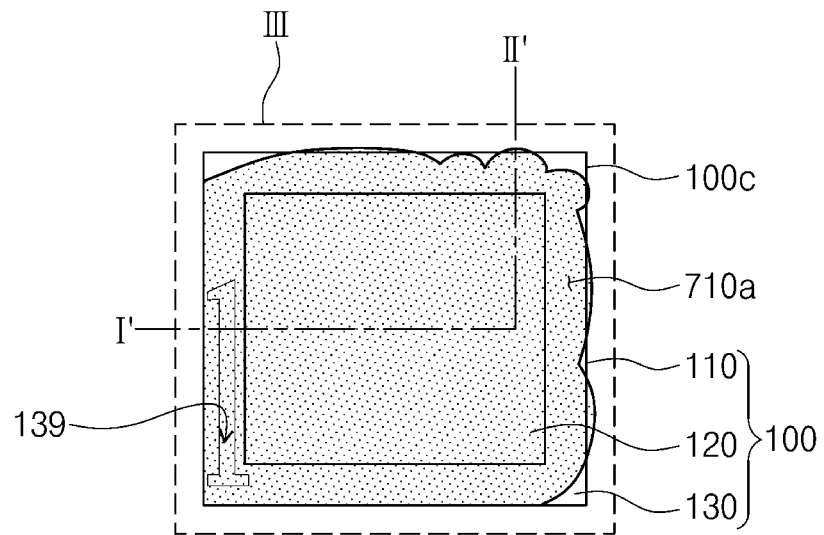
FIG. 1G corresponds to the enlarged view of the region III of FIG. 1A.
Figure 1H:
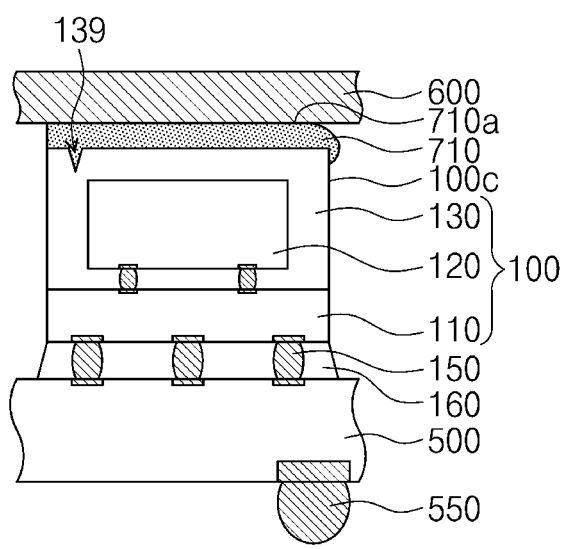
FIG. 1H is a cross-sectional view taken along the line I'-II' of FIG. 1G.

FIG. 1G corresponds to the enlarged view of the region III of FIG. 1A. FIG. 1H is a cross-sectional view taken along the line I'-II' of FIG. 1G. In the following description, FIGS. 1A, 1B, 1C, and 1D are referenced together.

Referring to FIGS. 1G and 1H, a first marker 139 may be provided on the first molding layer 130. For example, the first marker 139 may be provided on the upper surface of the first molding layer 130. Unlike this, the first marker 139 may be provided on the side surface of the first molding layer 130. The first marker 139 may be a recessed portion on one surface of the first molding layer 130. Formation of the first marker 139 may include removing a portion of the first molding layer 130. When the first marker 139 is formed on the first semiconductor chip 120, the first semiconductor chip 120 may be damaged during the formation of the first marker 139. For example, a crack may be formed on the first semiconductor chip 120 or in the first semiconductor chip 120. According to example embodiments, the first marker 139 may be provided on the first molding layer 130, so that the first semiconductor chip 120 may not be damaged in the process of forming the first marker 139. The first marker 139 may provide and display information about the first semiconductor package 100. In the drawings other than FIG. 1G to FIG. 1I, the first marker 139 is omitted for convenience, but inventive concepts are not limited thereto.

A first heat conduction layer 710 may be formed on the upper surface of the first semiconductor package 100. Formation of the first heat conduction layer 710 may include providing a thermal interface material on the first semiconductor package 100 and then curing the thermal interface material. The thermal interface material prior to curing may have fluidity. In the process of forming the first heat conduction layer 710, even if the thermal interface material on the edge region of the upper surface of the first semiconductor package 100 flows down to the side surface 100c of the first semiconductor package 100, the thermal interface material on the center region of the upper surface of the first semiconductor package 100 may not flow down. Thus, the first heat conduction layer 710 may well fill the gap between the center region of the upper surface of the first semiconductor package 100 and the heat dissipation structure 600. For example, the upper surface 710a of the first heat conduction layer 710 in the center region of the first semiconductor package 100 may be in physical contact with the heat dissipation structure 600. According to example embodiments, since the first molding layer 130 is provided, the first semiconductor chip 120 may be provided in the center region of the first semiconductor package 100 in plan view. Accordingly, even if the thermal interface material partly flows down in the process of forming the first heat conduction layer 710, the first heat conduction layer 710 may well transfer the heat of the first semiconductor chip 120 to the first heat dissipation structure 610. When the first molding layer 130 includes the first marker 139, the first heat conduction layer 710 may extend into the first marker 139. Referring to FIG. 1C, a second heat conduction layer 720 may be provided on the upper surface of the second molding layer 230. The formation of the second heat conduction layer 720 may be performed through substantially the same method described in the formation of the first heat conduction layer 710. Although the thermal interface material partly flows down during the formation of the second heat conduction layer 720, the second heat conduction layer 720 may well fill the gap between the center region of the upper surface of the second semiconductor package 200 and the heat dissipation structure 600. The center region of the second semiconductor package 200 may be a region provided with the second semiconductor chip 220. Accordingly, the heat generated from the second semiconductor chip 220 may be well emitted to the heat dissipation structure 600 through the second heat conduction layer 720.

Although not shown in the drawing, a second marker may be further provided on the second molding layer 230. The second marker may be the recessed portion of the second molding layer 230.

A third heat conduction layer 730 may be formed on the upper surface of the third molding layer 330. The formation of the third heat conduction layer 730 may be performed through substantially the same method described in the formation of the first heat conduction layer 710. At this time, although the thermal interface material partly flows down during the formation of the third heat conduction layer 730, the third heat conduction layer 730 may well fill the gap between the center region of the upper surface of the third semiconductor package 300 and the heat dissipation structure 600. The center region of the third semiconductor package 300 may be a region provided with the third semiconductor chip 320. Accordingly, the thermal characteristics of the third semiconductor package 300 may be improved. Although not shown in the drawing, a third marker may be further provided on the third molding layer 330. The third marker may be the recessed portion of the third molding layer 330.

Figure 1I:
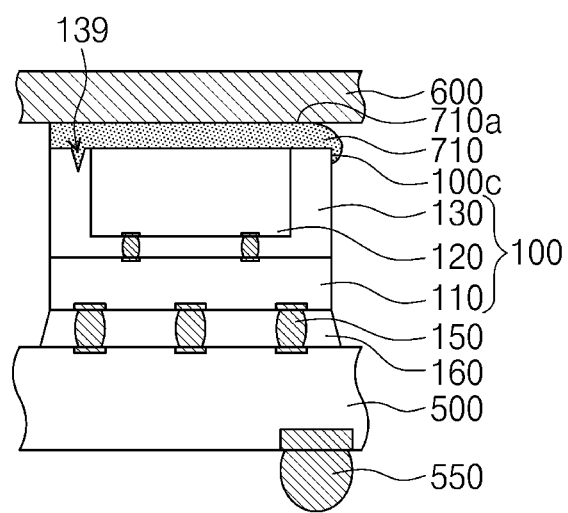
FIG. 1I is a view for explaining a first semiconductor package according to example embodiments.

FIG. 1I is a view for explaining a first semiconductor package according to example embodiments, and corresponds to a cross-section taken alone the line I'-II' of FIG. 1G.

Referring to FIGS. 1G and 1I, the first semiconductor package 100 may include a first substrate 110, a first semiconductor chip 120, and a first molding layer 130. The first molding layer 130 covers the side surface of the first semiconductor chip 120, and may expose the upper surface of the first semiconductor chip 120. In this case, the upper surface of the first semiconductor package 100 may correspond to the upper surface of the first molding layer 130 and the upper surface of the first semiconductor chip 120 exposed by the first molding layer 130. The upper surface of the exposed first semiconductor chip 120 may be in direct physical contact with the first heat conduction layer 710. Heat generated from the first semiconductor chip 120 may be transferred to the heat dissipation structure 600 through the first heat conduction layer 710. Accordingly, the heat dissipation characteristic of the first semiconductor chip 120 may be further improved.

Figure 2A:
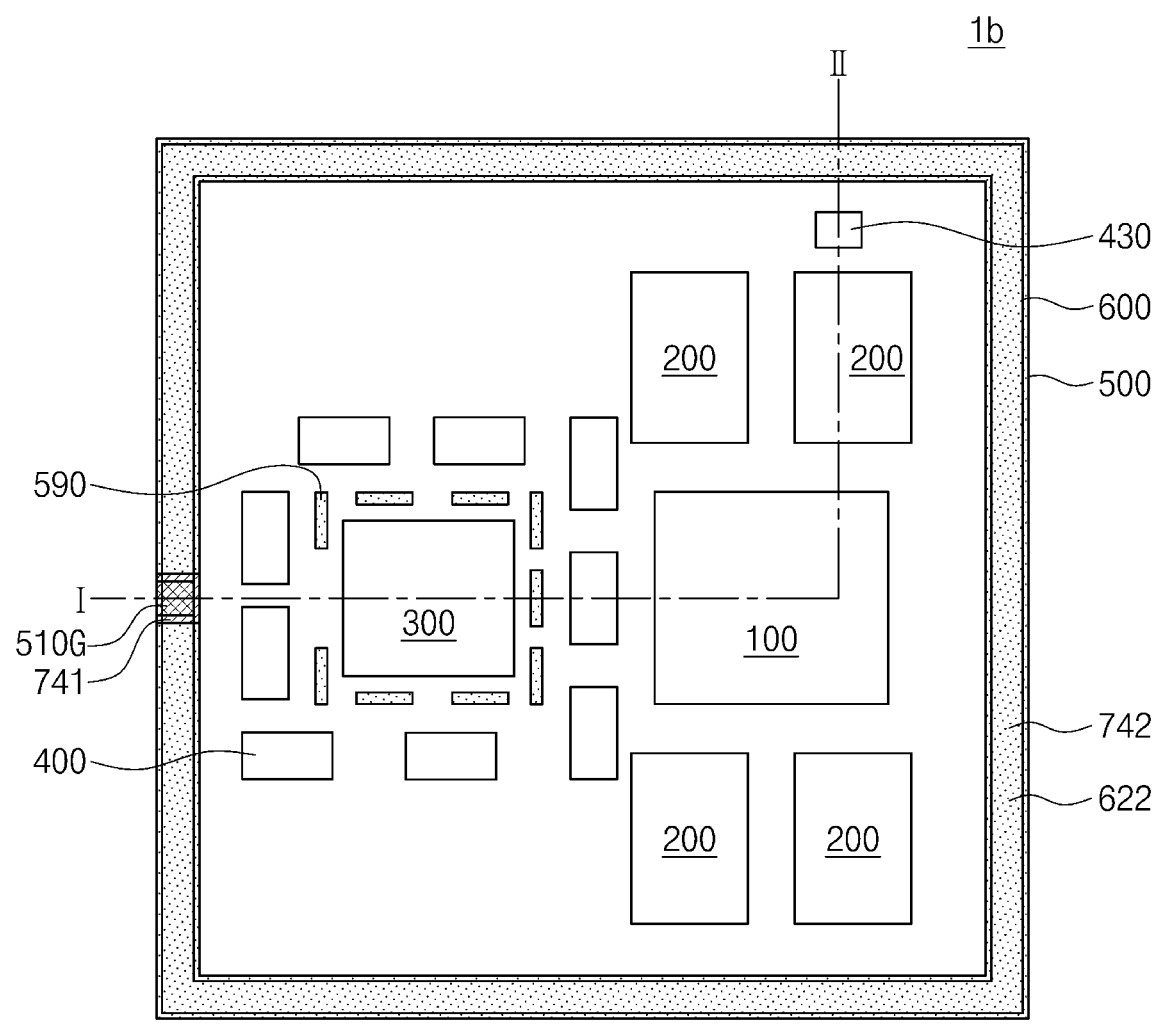
FIG. 2A is a plan view showing a package system according to example embodiments.
Figure 2B:
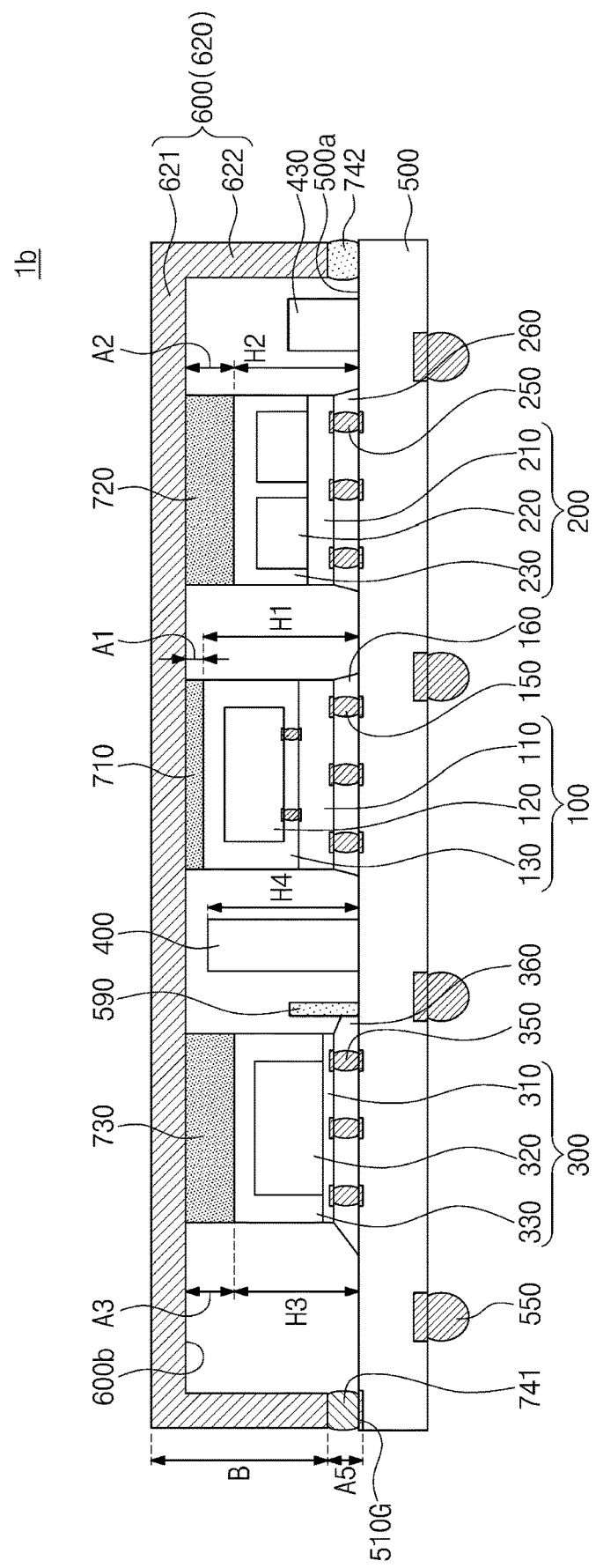
FIG. 2B is a cross-sectional view taken along the line I-II of FIG. 2A.

FIG. 2A is a plan view showing a package system according to example embodiments. FIG. 2B is a cross-sectional view taken along the line I-II of FIG. 2A. Hereinafter, the contents overlapping with those described above will be omitted.

Referring to FIGS. 2A and 2B, a package system 1b includes a substrate 500, first to third semiconductor packages 100, 200 and 300, a first passive element 400, first to third heat conduction layers 710, 720, and 730, and a heat dissipation structure 600. The substrate 500, the first to third semiconductor packages 100, 200 and 300, the first passive element 400 and the first to third heat conduction layers 710, 720, and 730 may be substantially the same as those described above with reference to FIGS. 1A to 1I.

A ground pattern may be provided on the upper surface 500a of the substrate 500. The ground pattern may include a ground pad 510G. At least one of the conductive terminals 550 may function as a ground terminal. A ground voltage may be applied to the ground pad 510G through the ground terminal and the substrate 500.

The heat dissipation structure 600 may include a second heat dissipation structure 620. The second heat dissipation structure 620 may include a body portion 621 and a leg portion 622. The body portion 621 of the second heat dissipation structure 620 may be similar to the first heat dissipation structure 610 previously described with reference to FIGS. 1A to 1C. The lower surface 600b of the heat dissipation structure 600 may include a lower surface of the body portion 621 of the second heat dissipation structure 620. For example, the body portion 621 may be provided on the upper surfaces of the first semiconductor package 100, the second semiconductor package 200, and the first passive element 400. The first heat conduction layer 710 may be in physical contact with the lower surface of the body portion 621 of the second heat dissipation structure 620.

The leg portion 622 of the second heat dissipation structure 620 may be provided between the edge region of the body portion 621 and the substrate 500. The leg portion 622 of the second heat dissipation structure 620 may be connected to the body portion 621. As shown in FIG. 2A, the first semiconductor package 100, the second semiconductor package 200, and the first passive element 400 may be spaced apart from the leg portion 622 of the second heat dissipation structure 620. The leg portion 622 may be provided in the edge region of the substrate 500 in plan view. The second heat dissipation structure 620 may include a thermally conductive material.

The second heat dissipation structure 620 has electrical conductivity and may shield electromagnetic interference (EMI) of the first, second, and third semiconductor packages 100, 200, and 300. The EMI means that electromagnetic waves that are radiated or conducted from an electrical element cause interference with the reception/transmission function of other electrical elements. By a second heat dissipation structure 620, the operation of the first to third semiconductor packages 100, 200, 300 and the first passive element 400 may not interrupt the operation of the other package or may not be interrupted by the other package.

Adhesive patterns 741 and 742 may be provided between the substrate 500 and the leg portions 622 of the second heat dissipation structure 620 to fix the second heat dissipation structure 620 to the substrate 500. The adhesive patterns 741 and 742 may include a conductive adhesive pattern 741 and an insulating adhesive pattern 742. The conductive adhesive pattern 741 may be provided between the ground pad 510G and the leg portion 622 of the second heat dissipation structure 620. The second heat dissipation structure 620 may be connected to the ground pad 510G through the conductive adhesive pattern 741.

If more than a certain amount of charges is accumulated in the heat dissipation structure 600, the charges may flow from the heat dissipation structure 600 into another electrically conductive component to damage the electrically conductive component. The electrically conductive component includes at least one of integrated circuits and wires in the first to third semiconductor chips 120, 220 and 320, wires in the first to third substrates 110, 210 and 310, the first to third connection terminals 150, 250, and 350, and interconnections in the substrate 500. According to example embodiments, a ground voltage may be applied to the second heat dissipation structure 620 by a conductive adhesive pattern 741. Accordingly, the second heat dissipation structure 620 may limit and/or prevent electrical damage of the package system 1b due to electrostatic discharge (ESD).

An insulating adhesive pattern 742 may be provided between the substrate 500 and the heat dissipation structure 600. Accordingly, the heat dissipation structure 600 is insulated from the substrate 500, so that the occurrence of electrical short may be limited and/or prevented. The thickness A5 of the conductive adhesive pattern 741 may be substantially the same as the thickness of the insulating adhesive pattern 742.

The height B of the leg portion 622 of the second heat dissipation structure 620 may be less than the height H1 of the mounted first semiconductor package 100. At this time, the height B of the leg portion 622 may be equal to the height of the inner surface of the second heat dissipation structure 620. The conductive adhesive pattern 741 may be in physical contact with the lower surface of the leg portion 622. Accordingly, the thickness A1 of the first heat conduction layer 710 may be less than the thickness of the adhesive patterns 741 and 742 (e.g., the thickness A5 of the conductive adhesive pattern 741). Since the thickness A1 of the first heat conduction layer 710 is small, heat generated from the first semiconductor package 100 may be transferred to the heat dissipation structure 600 through the first heat conduction layer 710 more quickly.

Figure 2C:
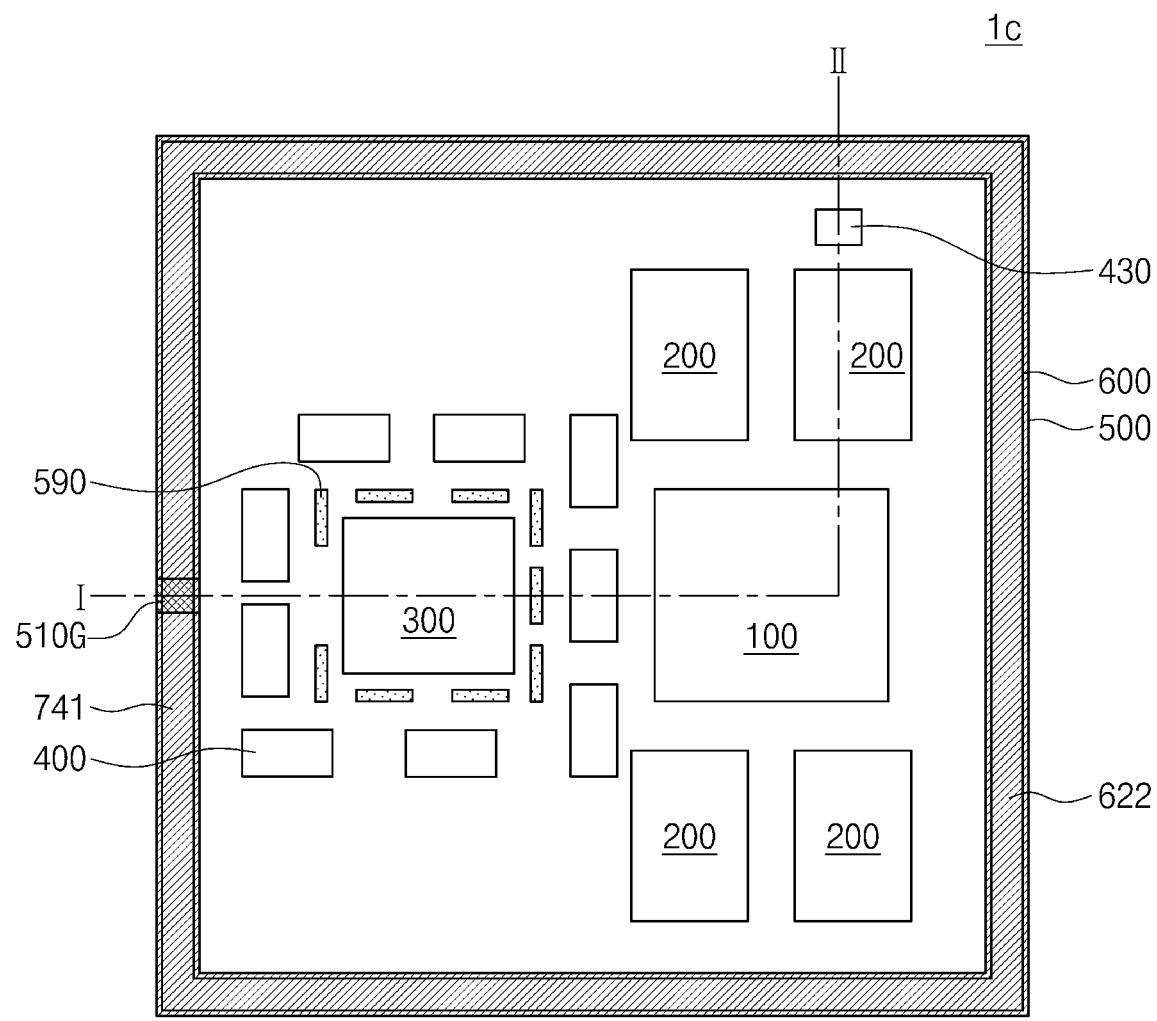
FIG. 2C is a plan view showing a package system according to example embodiments.
Figure 2D:
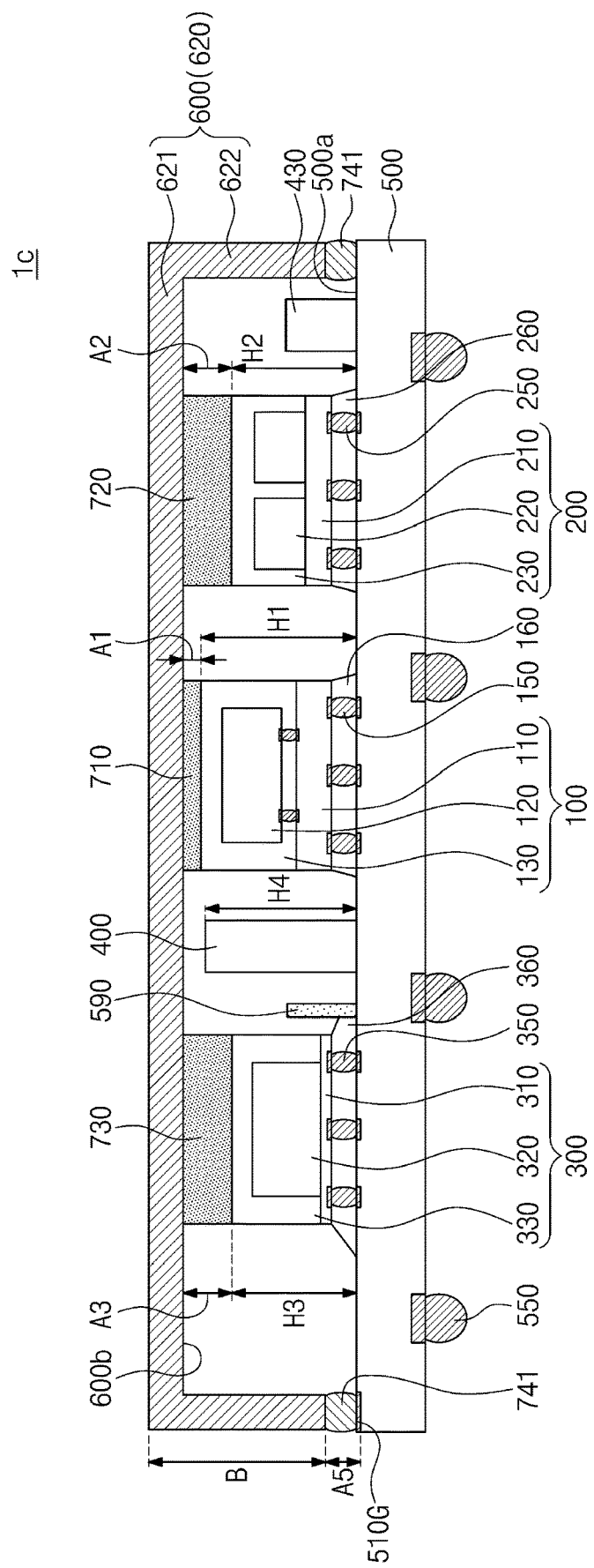
FIG. 2D is a cross-sectional view taken along the line I-II of FIG. 2C.

FIG. 2C is a plan view showing a package system according to example embodiments. FIG. 2D is a cross-sectional view taken along the line I-II of FIG. 2C. Hereinafter, the contents overlapping with those described above will be omitted.

Referring to FIGS. 2C and 2D, a package system 1c includes a substrate 500, first to third semiconductor packages 100, 200 and 300, a first passive element 400, first to third heat conduction layers 710, 720, and 730, and a heat dissipation structure 600. The heat dissipation structure 600 may include the second heat dissipation structure 620 described with reference to FIGS. 2A and 2B. For example, the second heat dissipation structure 620 may include a body portion 621 and a leg portion 622.

A conductive adhesive pattern 741 may be provided between the ground pad 510G and the leg portion 622 of the second heat dissipation structure 620 to connect with the second heat dissipation structure 620 and the ground pad 510G. Unlike the example of FIGS. 2A and 2B, an insulating adhesive pattern 742 may not be provided. The thickness A1 of the first heat conduction layer 710 may be less than the thickness A5 of the conductive adhesive pattern 741.

The substrate 500, the first to third semiconductor packages 100, 200 and 300, the first passive element 400 and the first to third heat conduction layers 710, 720, and 730 may be substantially the same as those described above with reference to FIGS. 1A to 1I.

Figure 2E:
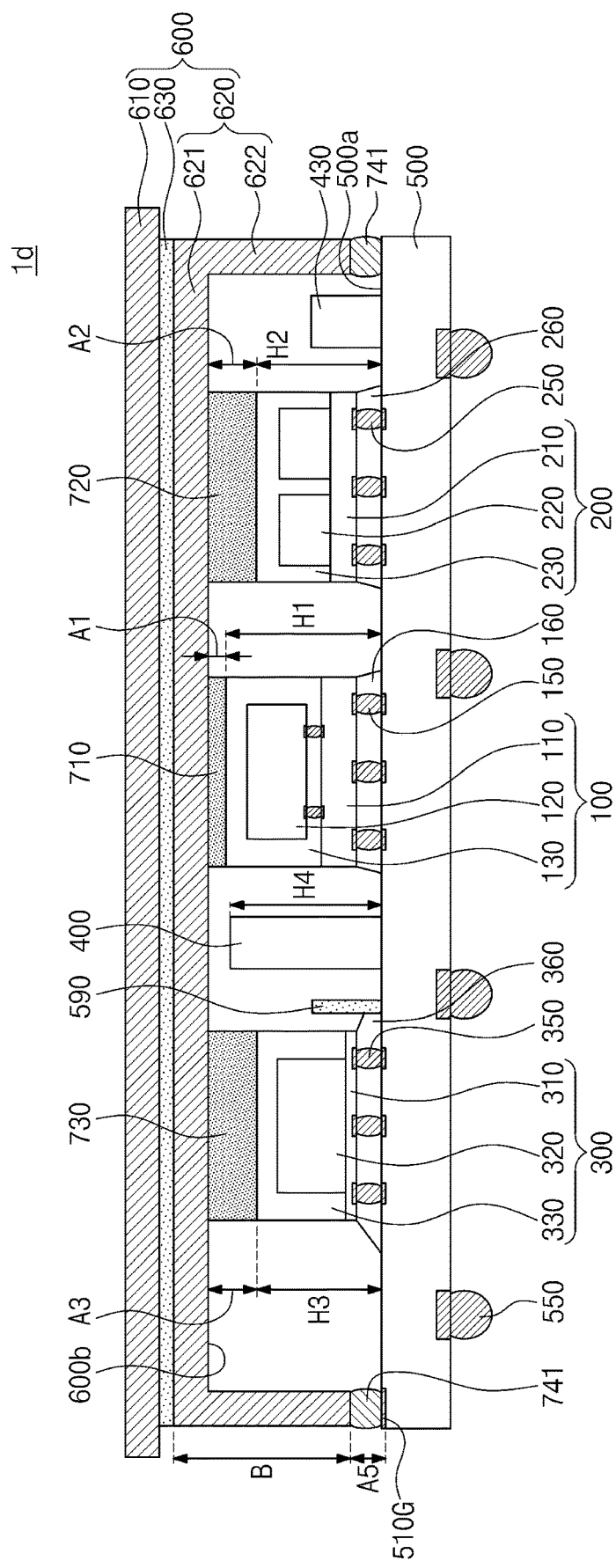
FIG. 2E is a cross-sectional view showing a package system according to example embodiments.

FIG. 2E is a view showing a package system according to example embodiments, corresponding to a cross-section taken along the line I-II of FIG. 2C. Hereinafter, the contents overlapping with those described above will be omitted.

Referring to FIGS. 2C and 2E, a package system 1d includes a substrate 500, first to third semiconductor packages 100, 200 and 300, a first passive element 400, first to third heat conduction layers 710, 720, and 730, and a heat dissipation structure 600. The substrate 500, the first to third semiconductor packages 100, 200 and 300, the first passive element 400 and the first to third heat conduction layers 710, 720, and 730 may be substantially the same as those described above with reference to FIGS. 1A to 1E.

The heat dissipation structure 600 may include a first heat dissipation structure 610, a second heat dissipation structure 620, and a heat dissipation layer 630. The first heat dissipation structure 610 may be substantially the same as that described above with reference to FIGS. 1A to 1C. However, the first heat dissipation structure 610 may be disposed on the upper surface of the second heat dissipation structure 620. The second heat dissipation structure 620 may be substantially the same as the second heat dissipation structure 620 described with reference to FIGS. 2A to 2D. For example, the second heat dissipation structure 620 may include a body portion 621 and a leg portion 622. The width of the first heat dissipation structure 610 may be equal to or wider than the width of the second heat dissipation structure 620. A conductive adhesive pattern 741 may be provided between the ground pad 510G and the second heat dissipation structure 620. As another example, an insulating adhesive pattern 742 as described in the example of FIGS. 2A and 2B may be further provided. The heat dissipation layer 630 may be interposed between the first heat dissipation structure 610 and the second heat dissipation structure 620. The heat dissipation layer 630 may include, for example, a thermal interface material.

Figure 3A:
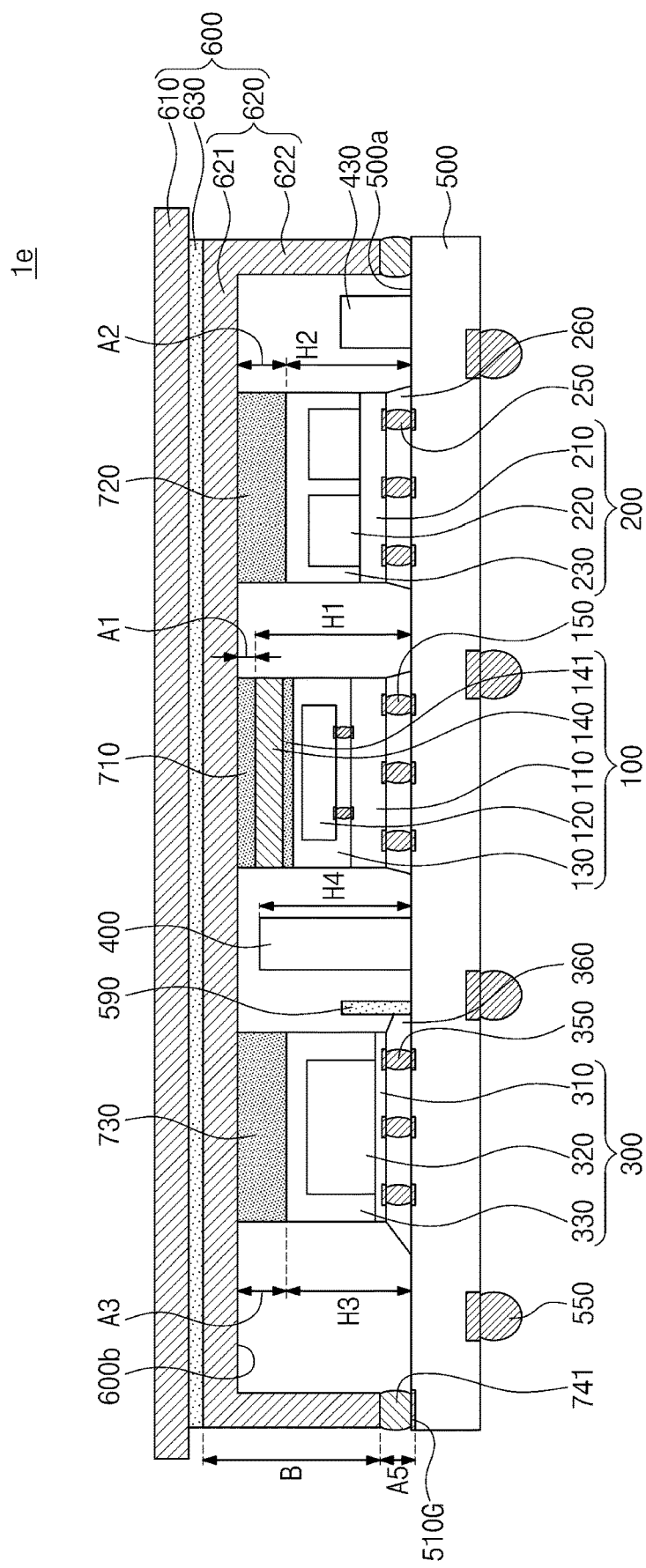
FIG. 3A is a cross-sectional view showing a package system according to example embodiments.

FIG. 3A is a cross-sectional view showing a package system according to example embodiments, corresponding to a cross-section taken along the line I-II of FIG. 2A. Hereinafter, the contents overlapping with those described above will be omitted.

Referring to FIGS. 2C and 3A, a package system 1e includes a substrate 500, first to third semiconductor packages 100, 200 and 300, a first passive element 400, first to third heat conduction layers 710, 720, and 730, and a heat dissipation structure 600.

The first semiconductor package 100 includes a first adhesive layer 141 and a first thermal conductive structure 140 in addition to the first substrate 110, the first semiconductor chip 120, and the first molding layer 130. The first thermal conductive structure 140 may have a relatively high thermal conductivity. The first thermal conductive structure 140 may include the thermally conductive material described in the example of FIGS. 1A to 1C. In one example, the first thermal conductive structure 140 may include a metal layer, a heat sink, or a heat pipe. As another example, the first thermal conductive structure 140 may use a water cooling method. The first adhesive layer 141 may be provided between the first molding layer 130 and the first thermal conductive structure 140. The first adhesive layer 141 may include a thermal interface material. During an operation of the first semiconductor package 100, heat generated from the first semiconductor chip 120 may be transferred to the first heat conduction layer 710 through the first adhesive layer 141 and the first thermal conductive structure 140.

According to example embodiments, the upper surface of the first semiconductor package 100 may correspond to the upper surface of the first thermal conductive structure 140. The height H1 of the mounted first semiconductor package 100 is defined as the sum of the height of the first connection terminals 150, the height of the first substrate 110, the height of the first molding layer 130, the height of the first adhesive layer 141, and the height of the first thermal conductive structure 140. Even if the upper surface of the first molding layer 130 is provided at a lower level than the upper surface of the second semiconductor package 200 or the upper surface of the third semiconductor package 300, by the provision of the first adhesive layer 141 and the first thermal conductive structure 140, the height H1 of the mounted first semiconductor package 100 may be greater than the height H2 of the mounted second semiconductor package 200 and the height H3 of the mounted third semiconductor package 300. The thickness A1 of the first heat conduction layer 710 may be less than the thickness A2 of the second heat conduction layer 720 and the thickness A3 of the third heat conduction layer 730. Accordingly, the thermal characteristics of the first semiconductor package 100 may be improved.

The substrate 500, the second and third semiconductor packages 200 and 300, the first passive element 400, the first to third heat conduction layers 710, 720, and 730, and the heat dissipation structure 600 may be substantially the same as those described with reference to FIGS. 1A to 1F and FIGS. 2A to 2E.

Figure 3B:
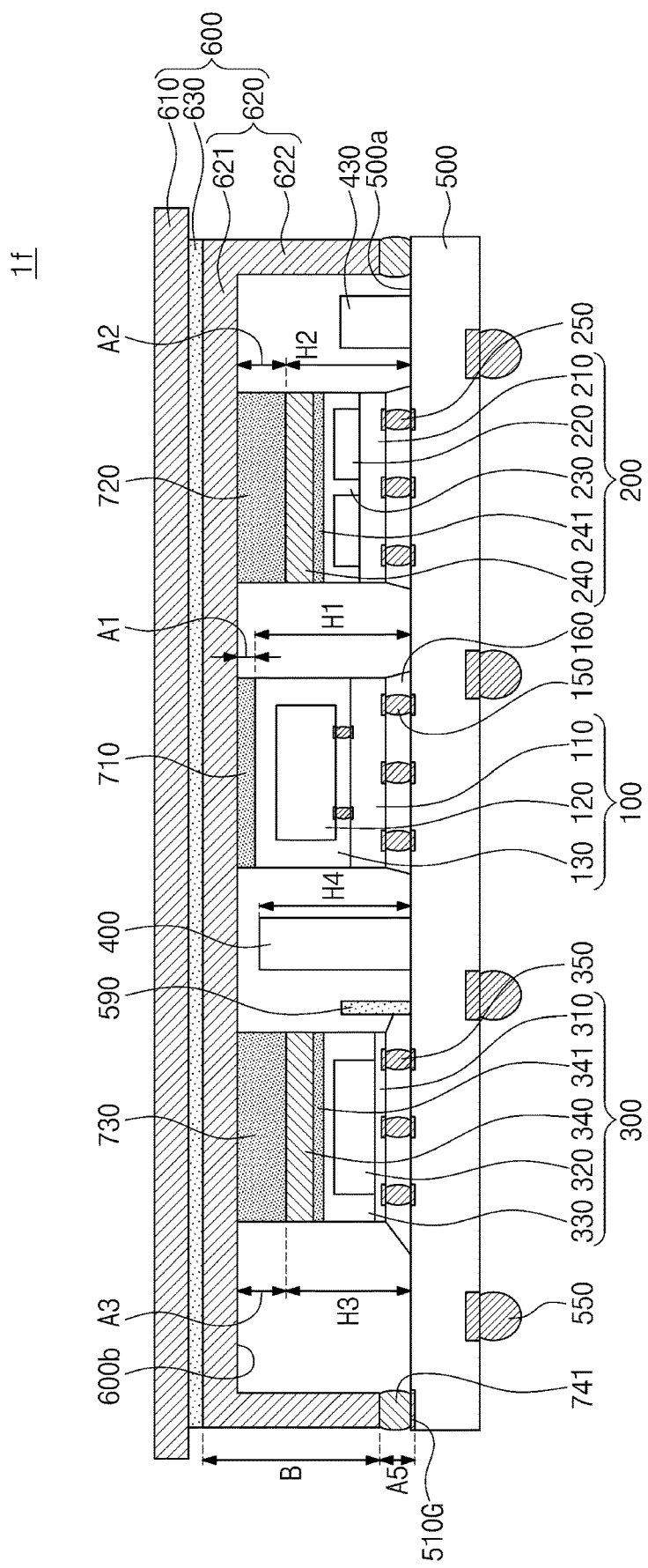
FIG. 3B is a cross-sectional view showing a package system according to example embodiments.

FIG. 3B is a cross-sectional view showing a package system according to example embodiments, corresponding to a cross-section taken along the line I-II of FIG. 2C. Hereinafter, the contents overlapping with those described above will be omitted.

Referring to FIGS. 2C and 3B, a package system 1f includes a substrate 500, first to third semiconductor packages 100, 200 and 300, a first passive element 400, first to third heat conduction layers 710, 720, and 730, and a heat dissipation structure 600. The substrate 500, the first semiconductor package 100, and the first passive element 400, the first to third heat conduction layers 710, 720, 730, and the heat dissipation structure 600 may be substantially the same as those described above.

The second semiconductor package 200 includes a second adhesive layer 241 and a second thermal conductive structure 240 in addition to the second substrate 210, the second semiconductor chip 220, and the second molding layer 230. The second thermal conductive structure 240 may include a thermally conductive material and may have a relatively high thermal conductivity. The second thermal conductive structure 240 may include a metal layer, a heat sink, or a heat pipe. The second adhesive layer 241 may be provided between the second molding layer 230 and the second thermal conductive structure 240. The second adhesive layer 241 may include a thermal interface material. During an operation of the second semiconductor package 200, heat generated from the second semiconductor chip 220 may be transferred to the second heat conduction layer 720 through the second adhesive layer 241 and the second thermal conductive structure 240.

The upper surface of the second semiconductor package 200 may correspond to the upper surface of the second thermal conductive structure 240. The height H2 of the mounted second semiconductor package 200 is defined as the sum of the height of the second connection terminals 250, the height of the second substrate 210, the height of the second molding layer 230, the height of the second adhesive layer 241, and the height of the second thermal conductive structure 240. The height H1 of the mounted first semiconductor package 100 may be greater than the height H2 of the mounted second semiconductor package 200. Accordingly, the thickness A1 of the first heat conduction layer 710 may be smaller than the thickness A2 of the second heat conduction layer 720.

The third semiconductor package 300 includes a third adhesive layer 341 and a third thermal conductive structure 340 in addition to the third substrate 310, the third semiconductor chip 320, and the third molding layer 330. The third thermal conductive structure 340 may include a thermally conductive material and may have a relatively high thermal conductivity. The third thermal conductive structure 340 may include a metal layer, a heat sink, or a heat pipe. The third adhesive layer 341 may be provided between the third molding layer 330 and the third thermal conductive structure 340. The third adhesive layer 341 may include a thermal interface material. During an operation of the third semiconductor package 300, heat generated from the third semiconductor chip 320 may be transferred to the third heat conduction layer 730 through the third adhesive layer 341 and the third thermal conductive structure 340.

The upper surface of the third semiconductor package 300 may correspond to the upper surface of the third thermal conductive structure 340. The height H3 of the mounted third semiconductor package 300 is defined as the sum of the height of the third connection terminals 350, the height of the third substrate 310, the height of the third molding layer 330, the height of the third adhesive layer 341, and the height of the third thermal conductive structure 340. The height H1 of the mounted first semiconductor package 100 may be greater than the height H3 of the mounted third semiconductor package 300. Accordingly, the thickness A1 of the first heat conduction layer 710 may be smaller than the thickness A3 of the third heat conduction layer 730.

Unlike what is shown, the second adhesive layer 241 and the second thermal conductive structure 240 are omitted, and the second heat conduction layer 720 may be in direct contact with the upper surface of the second molding layer 230 as shown in FIG. 1D. As another example, the third adhesive layer 341 and the third thermal conductive structure 340 are omitted, and the third heat conduction layer 730 may be in direct contact with the upper surface of the third molding layer 330.

Figure 3C:
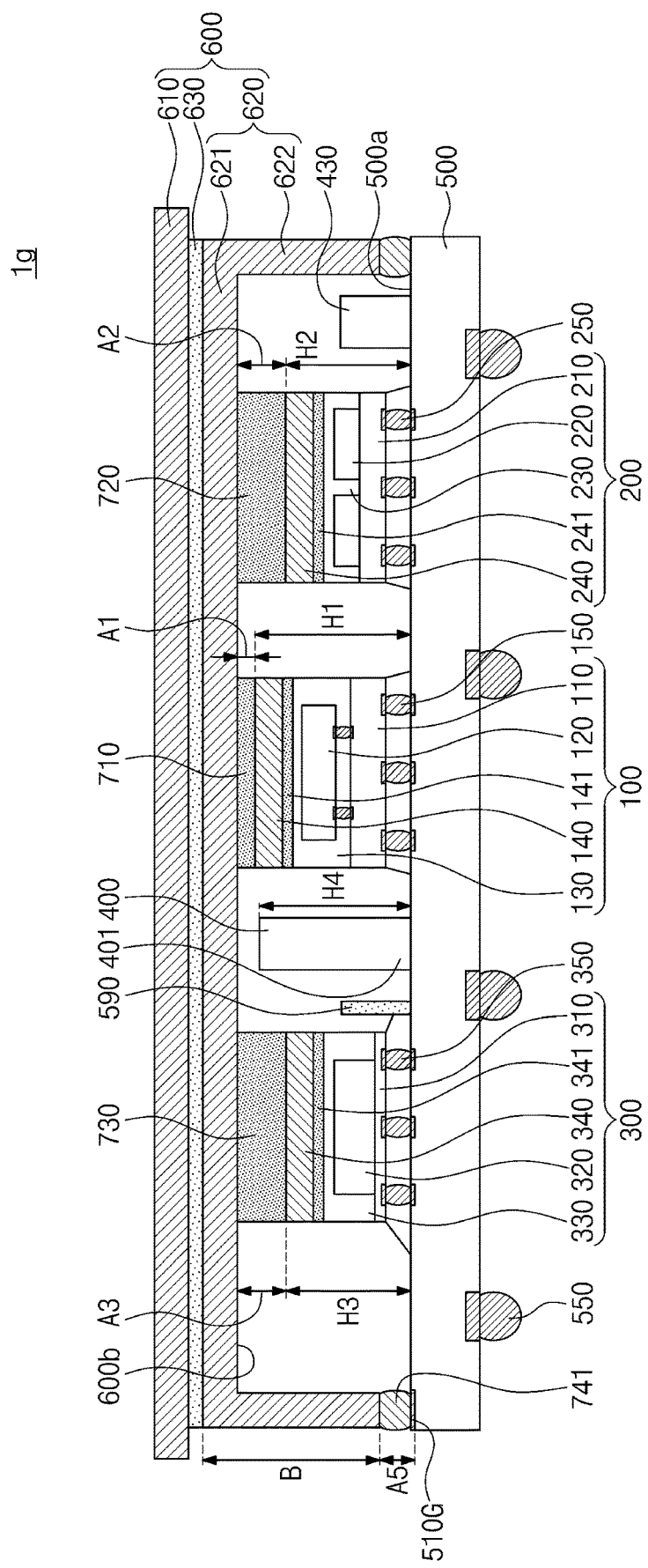
FIG. 3C is a cross-sectional view showing a package system according to example embodiments.

FIG. 3C is a cross-sectional view showing a package system according to example embodiments, corresponding to a cross-section taken along the line I-II of FIG. 2A. Hereinafter, the contents overlapping with those described above will be omitted.

Referring to FIGS. 2C and 3C, a package system 1g includes a substrate 500, a first to third semiconductor packages 100, 200 and 300, a first passive element 400, first to third heat conduction layers 710, 720, and 730, and a heat dissipation structure 600. The substrate 500, the first to third semiconductor packages 100, 200 and 300, the first passive element 400, the first to third heat conduction layers 710, 720, and 730, and the heat dissipation structure 600 are substantially the same as those described above.

The first semiconductor package 100 may be substantially the same as that described in the example of FIG. 3A. For example, the first semiconductor package 100 includes a first substrate 110, a first semiconductor chip 120, a first molding layer 130, a first adhesive layer 141, and a first thermal conductive structure 140. The second semiconductor package 200 and the third semiconductor package 300 may be substantially the same as those described in the example of FIG. 3B, respectively. The second semiconductor package 200 includes a second substrate 210, a second semiconductor chip 220, a second molding layer 230, a second adhesive layer 241, and a second thermal conductive structure 240. The third semiconductor package 300 includes a third substrate 310, a third semiconductor chip 320, a third molding layer 330, a third adhesive layer 341, and a third thermal conductive structure 340.

The height H1 of the mounted first semiconductor package 100 may be greater than the height H2 of the mounted second semiconductor package 200 and the height H3 of the mounted third semiconductor package 300. The thickness A1 of the first heat conduction layer 710 may be less than the thickness A2 of the second heat conduction layer 720 and the thickness A3 of the third heat conduction layer 730.

Figure 4A:
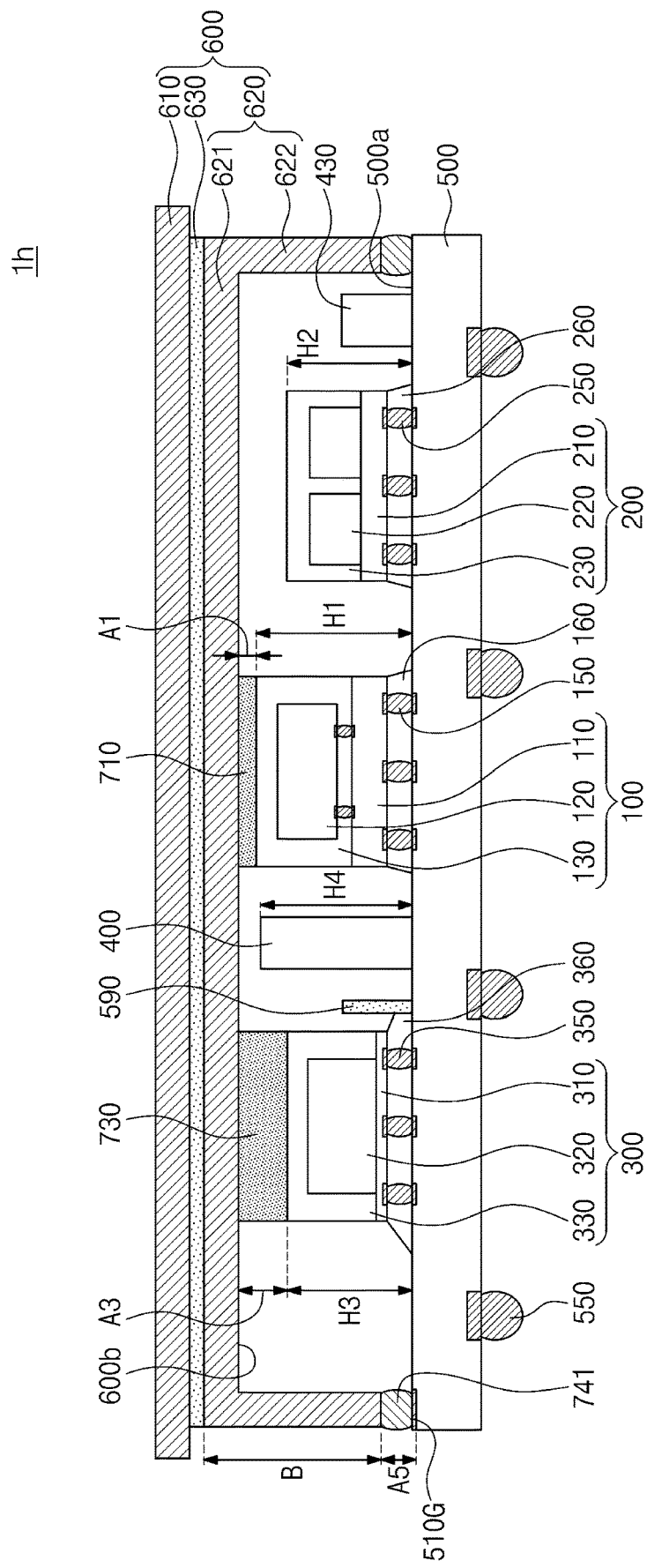
FIG. 4A is a cross-sectional view showing a package system according to example embodiments.

FIG. 4A is a cross-sectional view showing a package system according to example embodiments, corresponding to a cross-section taken along the line I-II of FIG. 2C. FIG.

4B is a cross-sectional view showing a package system according to example embodiments, corresponding to a cross-section taken along the line I-II of FIG. 2C. Hereinafter, the contents overlapping with those described above will be omitted.

Figure 4B:
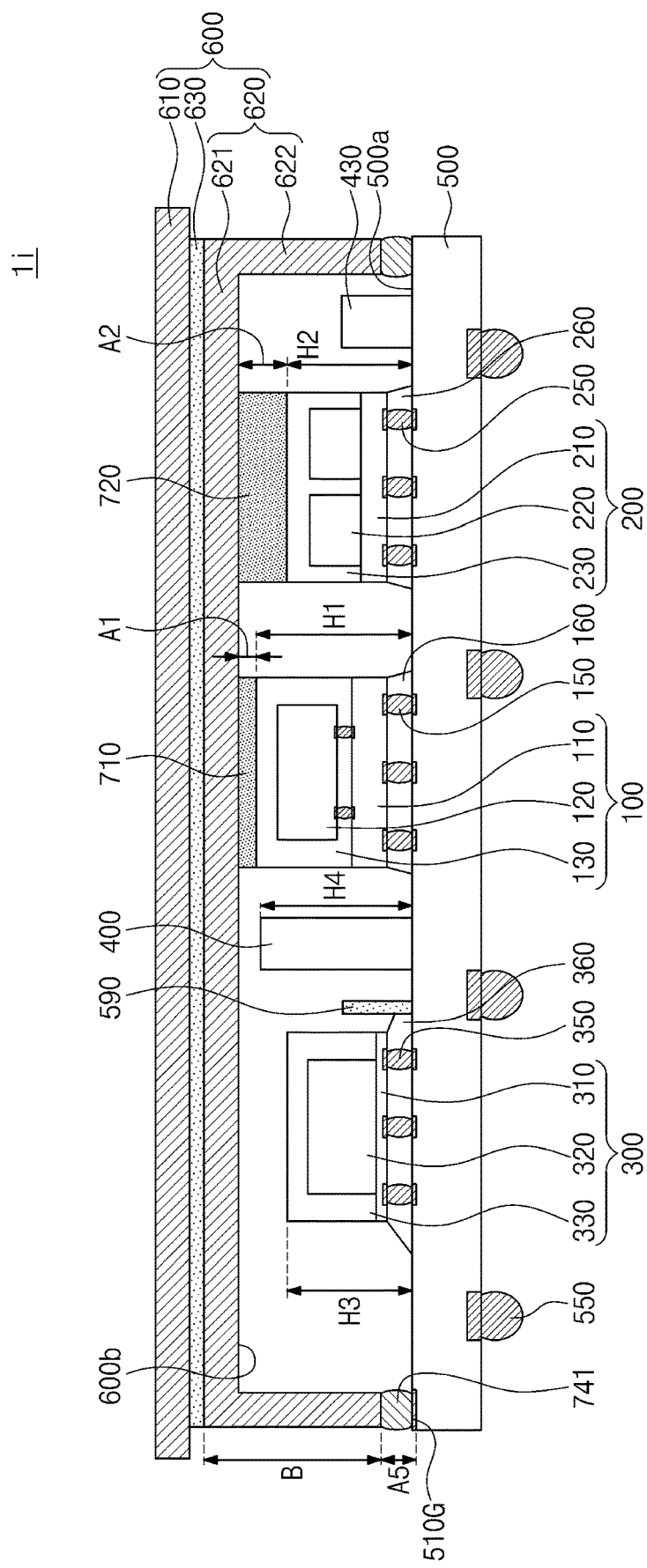
FIG. 4B is a cross-sectional view showing a package system according to example embodiments.

Referring to FIGS. 2C, 4A, and 4B, a package system 1h or 1i includes a substrate 500, first to third semiconductor packages 100, 200 and 300, a first passive element 400, first heat conduction layer 710, and a heat dissipation structure 600. The substrate 500, the first to third semiconductor packages 300, the first passive element 400, the first heat conduction layer 710, and the heat dissipation structure 600 are substantially the same as those described above.

As shown in FIG. 4A, the package system 1h may not include the second heat conduction layer 720. The sum of the height H1 of the mounted first semiconductor package 100 and the thickness A1 of the first heat conduction layer 710 may be greater than the height H2 of the mounted second semiconductor package 200.

As shown in FIG. 4B, the package system 1i may not include a third heat conduction layer 730. The sum of the height H1 of the mounted first semiconductor package 100 and the thickness A1 of the first heat conduction layer 710 may be greater than the height H3 of the mounted third semiconductor package 300.

Figure 4C:
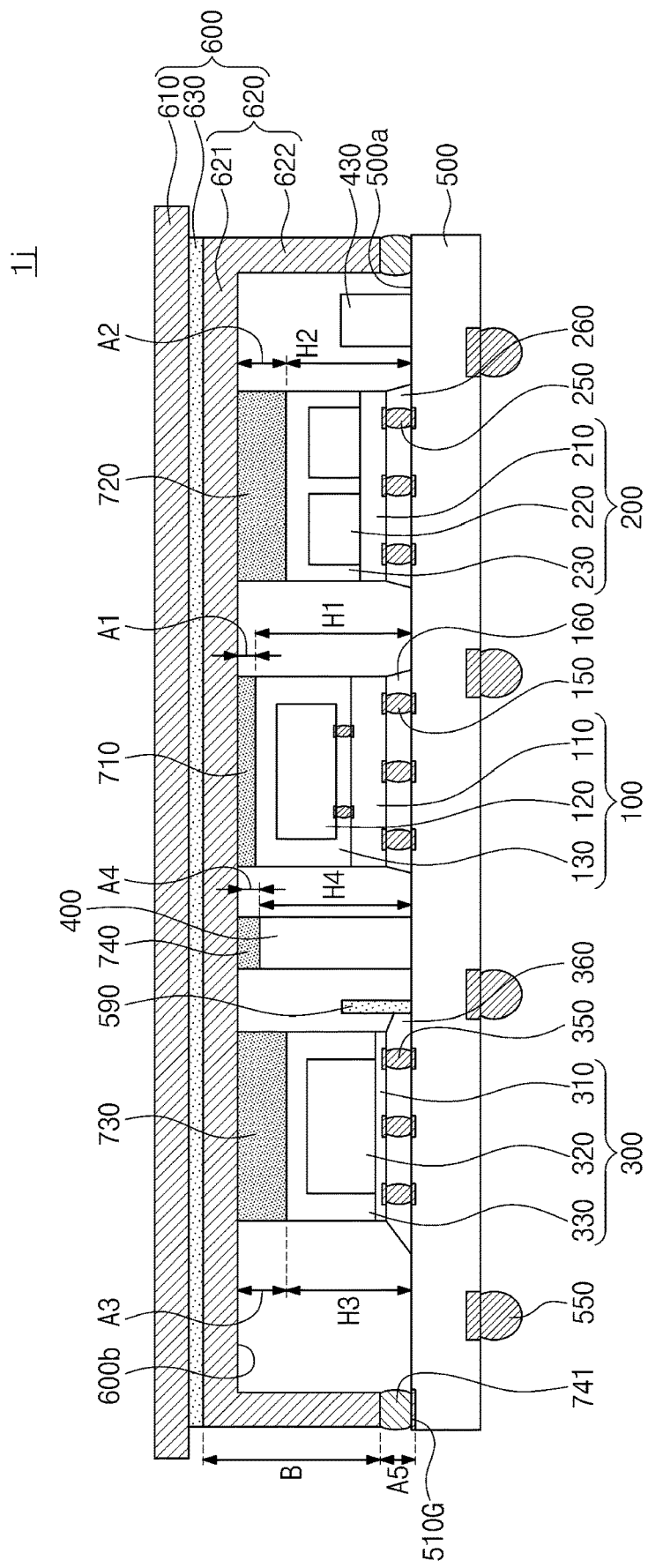
FIG. 4C is a cross-sectional view showing a package system according to example embodiments.

FIG. 4C is a cross-sectional view showing a package system according to example embodiments, corresponding to a cross-section taken along the line I-II of FIG. 2C. Hereinafter, the contents overlapping with those described above will be omitted.

Referring to FIGS. 2C and 4C, a package system 1j includes a substrate 500, first to third semiconductor packages 100, 200 and 300, a first passive element 400, first to third heat conduction layers 710, 720, and 730, and a heat dissipation structure 600. The thickness A1 of the first heat conduction layer 710 may be less than the thickness A2 of the second heat conduction layer 720 and the thickness A3 of the third heat conduction layer 730.

A fourth heat conduction layer 740 is provided between the first passive element 400 and the heat dissipation structure 600 so that it may be in physical contact with the upper surface of the first passive element 400 and the lower surface 600b of the heat dissipation structure 600. The fourth heat conduction layer 740 may include a thermal interface material. Heat generated from the first passive element 400 may be transferred to the heat dissipation structure 600 through the fourth heat conduction layer 740. The height H1 of the mounted first semiconductor package 100 may be greater than the height H4 of the mounted first passive element 400. For example, the upper surface of the first semiconductor package 100 may be disposed at a higher level than the upper surface of the first passive element 400. Accordingly, the thickness A1 of the first heat conduction layer 710 may be smaller than the thickness A4 of the fourth heat conduction layer 740.

As another example, either the second heat conduction layer 720 or the third heat conduction layer 730 may be omitted.

In the description of FIGS. 3A to 3C and 4A to 4C, either the first heat dissipation structure 610 or the second heat dissipation structure 620 may be omitted. In this case, the heat dissipation layer 630 may not be provided.

In the description of FIGS. 4A to 4C, the first semiconductor package 100 may further include a first adhesive layer 141 and a first thermal conductive structure 140. The second semiconductor package 200 may further include a second adhesive layer 241 and a second thermal conductive structure 240. The third semiconductor package 300 may further include a third adhesive layer 341 and a third thermal conductive structure 340.

Figure 5A:
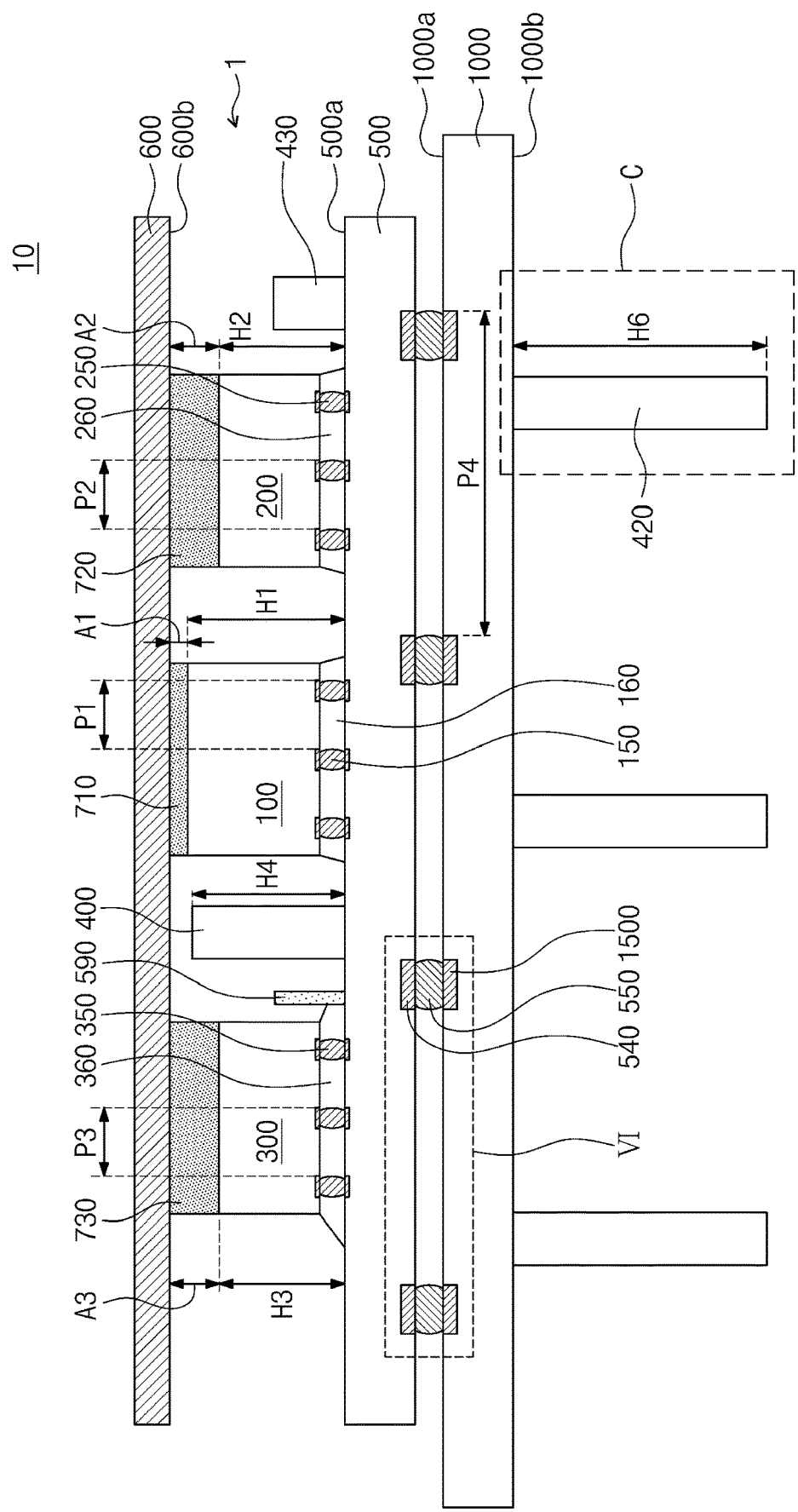
FIG. 5A is a cross-sectional view showing a semiconductor module according to example embodiments.
Figure 5B:
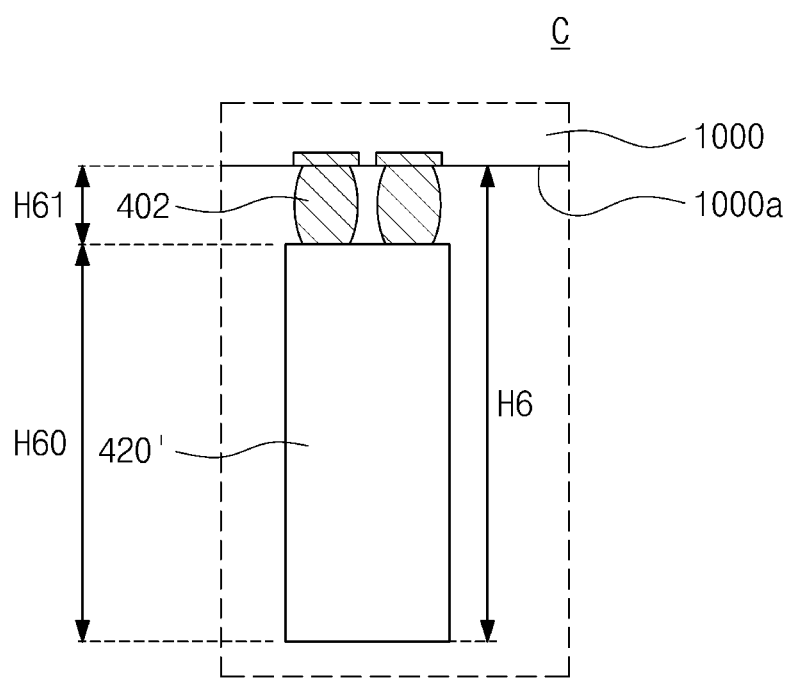
FIG. 5B is a view for explaining a second passive element according to example embodiments, and is a cross-sectional view showing an enlarged view of the region C of FIG. 5A.
Figure 5C:
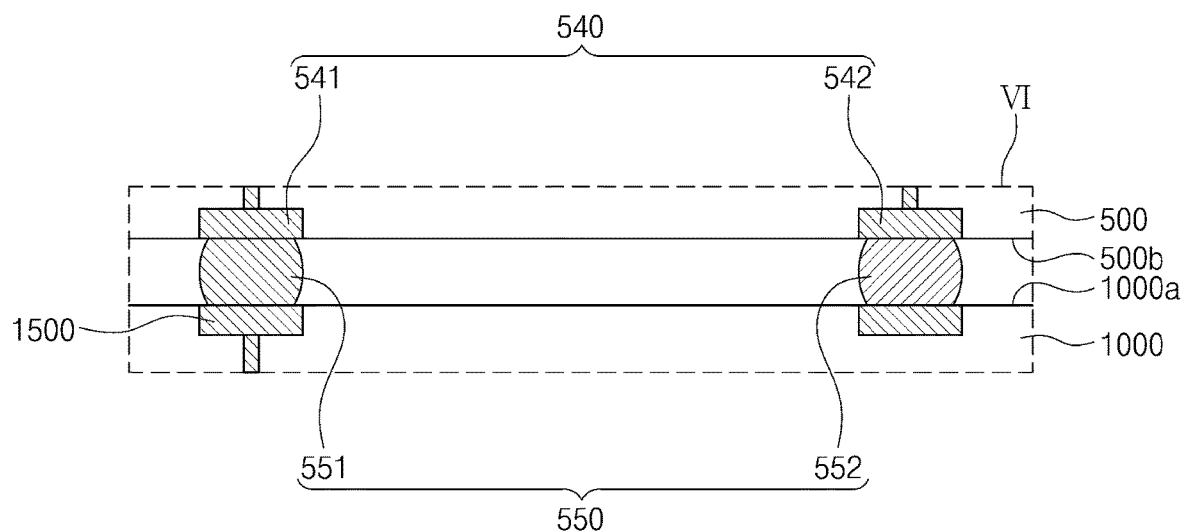
FIG. 5C is a view for explaining lower pads and conductive terminals according to example embodiments.
Figure 5D:
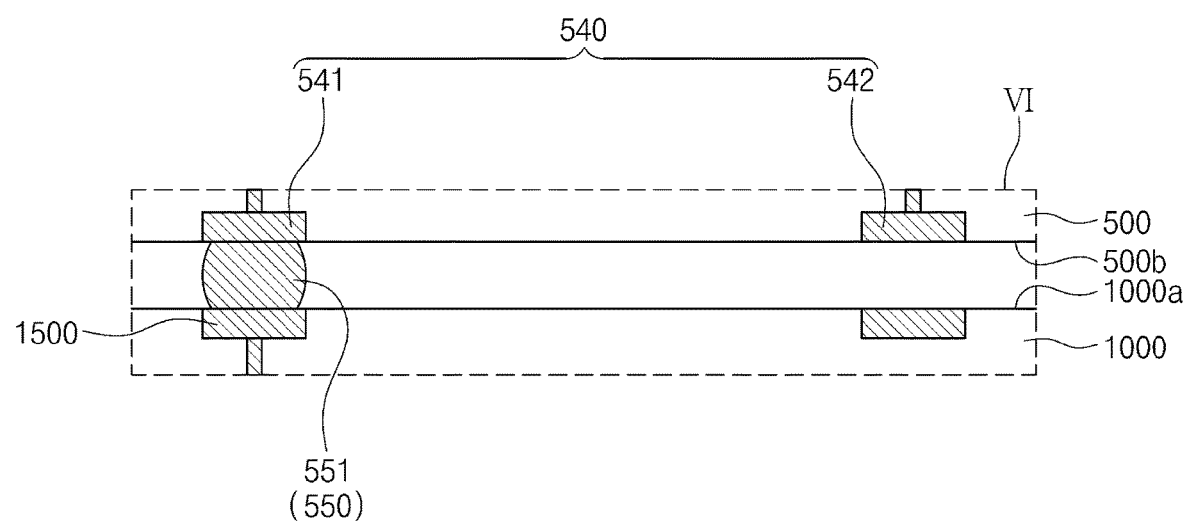
FIG. 5D is a view for explaining lower pads according to example embodiments.

FIG. 5A is a cross-sectional view showing a semiconductor module according to example embodiments. FIG. 5B is a view for explaining a second passive element according to example embodiments, and is a cross-sectional view showing an enlarged view of the region C of FIG. 5A. FIG. 5C is a view for explaining lower pads and conductive terminals according to example embodiments, and shows the enlarged region VI of FIG. 5A. FIG. 5D is a view for explaining lower pads according to example embodiments. Hereinafter, the contents overlapping with those described above will be omitted.

Referring to FIGS. 1A, 5A, and 5B, the semiconductor module 10 may include a board 1000 and a package system 1. For example, a printed circuit board may be used as the board 1000. Conductive pads 1500 may be provided on the upper surface 1000a of the board 1000. The conductive pads 1500 may be electrically connected to internal wires (not shown) of the board 1000. Electrical connection with the board 1000 in this specification may mean electrical connection with the internal wires of the board 1000.

The package system 1 described with reference to FIGS. 1A to 1C may be mounted on the board 1000 so that the semiconductor module 10 may be formed. As another example, the package system 1a of FIG. 1F, the package system 1b of FIGS. 2A and 2B, the package system 1c of FIGS. 2C and 2D, the package system 1d of FIG. 2E, the package system 1e of FIG. 3A, the package system 1f of FIG. 3B, the package system 1g of FIG. 3C, the package system 1h of FIG. 4A, the package system 1i of FIG. 4B, or the package system 1j of FIG. 4C is mounted on the board 1000, so that the semiconductor module 10 may be formed. For convenience, the package system 1 of FIGS. 1A to 1C is shown and described with respect to the semiconductor module 10 mounted on the board 1000, but inventive concepts are not limited thereto.

The packaging of the package system 1 includes providing the package system 1 on the board 1000 such that the conductive terminals 550 face the board 1000 and electrically connecting the conductive terminals 550 to the conductive pads 1500. The pitch of the conductive terminals 550 may be substantially the same as the pitch P4 of the conductive pads 1500. The pitch P4 of the conductive pads 1500 may be standardized. For example, the pitch P4 of the conductive pads 1500 may satisfy the Joint Electron Device Engineering Council (JEDEC) standard. The pitch P4 of the conductive pads 1500 may be large. For example, the pitch P4 of the conductive pads 1500 may be 0.65 mm or more.

When the first semiconductor package 100, the second semiconductor package 200, and the third semiconductor package 300 are directly mounted on the board 1000, each of the pitch P1 of the first connection terminals 150, the pitch P2 of the second connection terminals 250, and the pitch P3 of the third connection terminals 350 may be required to be substantially the same as the pitch P4 of the conductive pads 1500. According to example embodiments, the first semiconductor package 100, the second semiconductor package 200, and the third semiconductor package 300 may be connected to the board 1000 through the substrate 500. Accordingly, the pitch P1 of the first connection terminals 150, the pitch P2 of the second connection terminals 250, and the pitch P3 of the third connection terminals 350 are freely designed without being constrained by the pitch P4 of the conductive pads 1500.

The pitch P1 of the first connection terminals 150 may be smaller than the pitch P4 of the conductive pads 1500. For example, the pitch P1 of the first connection terminals 150 may be 0.4 mm or less. Accordingly, the first connection terminals 150 are provided more densely, so that the planar area of the first semiconductor package 100 may be reduced. The pitch P2 of the second connection terminals 250 and the pitch P3 of the third connection terminals 350 may be smaller than the pitch P4 of the conductive pads 1500. For example, each of the pitch P2 of the second connection terminals 250 and the pitch P3 of the third connection terminals 350 may be 0.4 mm or less. Accordingly, the second semiconductor package 200 and the third semiconductor package 300 may be miniaturized. Since the first to third semiconductor packages 100, 200, 300 are miniaturized, the distances between the first to third semiconductor packages 100, 200, 300 may be reduced. Thus, the lengths of the electrical signal paths between the first to third semiconductor packages 100, 200, and 300 may be reduced. The operating speed and reliability of the package system 1 may be improved.

The second passive element 420 may be mounted on the lower surface 1000b of the board 1000. As shown in FIG. 5B, the second connection terminal portions 402 may be further provided between the board 1000 and the second passive element 420. The second passive element 420 may be connected to the board 1000 through the second connection terminal portions 402. The second connection terminal portions 402 may include, for example, a solder, a pillar, a bump, or a ball grid array. The height H6 of the mounted second passive element 420 may be defined as including the height H61 of the second connecting terminal portions 402. For example, the height H6 of the mounted second passive element 420 is equal to the sum of the height H61 of the second connection terminal portions 402 and the height H60 of the second passive element 420' before being mounted. For example, the height H6 of the mounted second passive element 420 may be greater than the sum of the height H1 of the mounted first semiconductor package 100 and the thickness A1 of the first heat conduction layer 710. Even if the height H6 of the mounted second passive element 420 is large, the second passive element 420 may be electrically connected to the package system 1 through the substrate 500.

The second passive element 420 may be electrically connected to one of the first to third semiconductor packages 100, 200, and 300. The second passive element 420 may be provided overlapping or adjacent to the one of the semiconductor packages 100, 200, and 300 in plan view. Accordingly, the length of the electrical signal path between the second passive element 420 and the one of the semiconductor packages 100, 200, and 300 may be reduced. Thus, the electrical characteristics of the semiconductor module 10 may be improved.

The second passive element 420 may be provided in plurality. In this case, the heights H6 of the second passive elements 420 may be equal to or different from each other. The number of the second passive elements 420 may be variously modified. Hereinafter, referring to FIGS. 5C and 5D, the conductive terminals 550 and the lower pads 540 will be described.

The lower pads 540 may be provided on the lower surface of the substrate 500. The lower pads 540 may include a connection pad 541 and a test pad 542. During the manufacturing process of the package system 1 or before the package system 1 is mounted on the board 1000, the electrical characteristics of the package system 1 may be evaluated. Evaluation of the electrical characteristics may be performed using the test pad 542. For example, as a probe (not shown) contacts the test pad 542, the electrical characteristics and the connection relationship of at least one of the first to third semiconductor packages 100, 200, and 300, the first passive element 400, and the electronic element 430 may be evaluated. Thereafter, the conductive terminals 550 are formed, and the package system 1 may be mounted on the board 1000.

As shown in FIG. 5C, the conductive terminals 550 may include a first terminal 551 and a second terminal 552. The first terminal 551 is provided on the lower surface of the connection pad 541 and may be connected to the connection pad 541 and corresponding one of the conductive pads 1500. The first terminal 551 may electrically connect the package system 1 to the board 1000. The first terminal 551 may function as a path for signal transmission.

The second terminal 552 is provided on the lower surface of the test pad 542 and may be connected to the test pad 542. For example, the second terminal 552 may function as a ground terminal. The ground voltage is transmitted to the package system 1 through the board 1000 and the second terminal 552. As another example, the second terminal 552 may be a dummy terminal. For example, the second terminal 552 may not be electrically connected to an internal wire in the board 1000. Alternatively, the second terminal 552 may not be electrically connected to the package system 1.

As shown in FIG. 5D, the second terminal (552 in FIG. 5C) may not be provided. The test pad 542 may be spaced apart from the board 1000 and electrically insulated. Although not shown in the drawing, the underfill material may be filled in the gap between the board 1000 and the test pad 542. The underfill material may include an insulating polymer.

According to inventive concepts, during an operation of the package system, the first semiconductor package may generate a lot of heat. The thickness of the first heat conduction layer may be less than the thickness of the second heat conduction layer and the thickness of the third heat conduction layer. As the thickness of the first heat conduction layer decreases, the thermal characteristics of the first semiconductor package may be improved. The package system may show improved operating characteristics.

Although some example embodiments of inventive concepts have been described, it is understood that inventive concepts should not be limited to these embodiments but various changes and modifications may be made by one ordinary skilled in the art within the spirit and scope of inventive concepts as hereinafter claimed.

What is claimed is:

1. A semiconductor package system comprising:
   a substrate;
   a first semiconductor package on the substrate;
   a second semiconductor package on the substrate, the second semiconductor package being spaced apart from the first semiconductor package in a first direction;
   a first passive element on the substrate, the first passive element being spaced apart from the first semiconductor package in a second direction crossing the first direction;
   a heat dissipation structure on the first semiconductor package, the second semiconductor package, and the first passive element; and
   a first heat conduction layer between the first semiconductor package and the heat dissipation structure, a sum of a height of the first semiconductor package and a thickness of the first heat conduction layer being greater than a height of the first passive element, and
the height of the first semiconductor package being greater than a height of the second semiconductor package.

2. The semiconductor package system of claim 1, further comprising:
a second heat conduction layer provided between the second semiconductor package and the heat dissipation structure, wherein
the thickness of the first heat conduction layer is less than a thickness of the second heat conduction layer.

3. The semiconductor package system of claim 2, wherein the first heat conduction layer and the second heat conduction layer are in physical contact with the heat dissipation structure.

4. The semiconductor package system of claim 1, wherein
the first semiconductor package includes a first substrate, a first semiconductor chip, and a first molding layer, and
the first semiconductor chip is a system-on-chip.

5. The semiconductor package system of claim 4, wherein the first semiconductor package further includes a first thermal conductive structure on the first molding layer.

6. The semiconductor package system of claim 5, wherein an upper surface of the first molding layer is at a lower level than an upper surface of the second semiconductor package.

7. The semiconductor package system of claim 1, wherein
the second semiconductor package includes a second substrate, a second semiconductor chip, a second molding layer, and a second thermal conductive structure on the second molding layer.

8. The semiconductor package system of claim 1, further comprising:
a ground pattern on an upper surface of the substrate; and
a conductive adhesive pattern between the ground pattern and the heat dissipation structure, wherein
the heat dissipation structure includes a body portion and a leg portion,
the body portion extends in parallel to the upper surface of the substrate,
the leg portion is connected to the body portion,
the leg portion is between the substrate and the body portion, and
the heat dissipation structure is electrically connected to the ground pattern through the conductive adhesive pattern.

9. The semiconductor package system of claim 8, wherein the thickness of the first heat conduction layer is less than a thickness of the conductive adhesive pattern.

10. The semiconductor package system of claim 1, further comprising:
a board on a lower surface of the substrate;
conductive terminals connected to the substrate and the board; and
a second passive element on a lower surface of the board, wherein
a height of the second passive element is greater than the height of the first semiconductor package.

11. The semiconductor package system of claim 10, further comprising:
first connection terminals between the substrate and the first semiconductor package, wherein
a pitch of the first connection terminals is smaller than a pitch of the conductive terminals.

12. A semiconductor package system comprising:
a substrate;
a first semiconductor package on an upper surface of the substrate, the first semiconductor package including a first semiconductor chip, the first semiconductor chip including one or more logic circuits;
a second semiconductor package on the upper surface of the substrate, the second semiconductor package being spaced apart from the first semiconductor package in a first direction;
a passive element on the upper surface of the substrate, the passive element being spaced apart from the first semiconductor package in a second direction crossing the first direction;
a heat dissipation structure on the first semiconductor package, the second semiconductor package, and the passive element; and
a plurality of heat conduction layers that are each in physical contact with a lower surface of the heat dissipation structure,
the plurality of heat conduction layers including a first heat conduction layer on an upper surface of the first semiconductor package, and the first heat conduction layer having a thinnest thickness among the plurality of heat conduction layers.

13. The semiconductor package system of claim 12, wherein a height of the first semiconductor package is greater than a height of the second semiconductor package.

14. The semiconductor package system of claim 13, wherein
the first semiconductor package further includes a first substrate, a first molding layer, and a first thermal conductive structure,
the first semiconductor chip is on the first substrate,
the first molding layer is configured to cover the first semiconductor chip, and
the first thermal conductive structure is on the first molding layer.

15. The semiconductor package system of claim 12, wherein a sum of a height of the first semiconductor package and a thickness of the first heat conduction layer is greater than a height of the passive element.

16. The semiconductor package system of claim 12, wherein the plurality of heat conduction layers further include a second heat conduction layer on an upper surface of the second semiconductor package.

17. The semiconductor package system of claim 16, wherein the second semiconductor package includes a power management chip or a memory chip.

18. A semiconductor package system comprising:
a substrate;
a first semiconductor package on the substrate, the first semiconductor package including a first semiconductor chip, the first semiconductor chip including one or more logic circuits;
a second semiconductor package on the substrate;
a passive element on the substrate;
a heat dissipation structure on the first semiconductor package, the second semiconductor package, and the passive element;
a first heat conduction layer on the first semiconductor package, the first heat conduction layer in physical contact with the heat dissipation structure; and
a second heat conduction layer on the second semiconductor package, the second heat conduction layer in physical contact with the heat dissipation structure, a thickness of the first heat conduction layer being smaller than a thickness of the second heat conduction layer, an upper surface of the first heat conduction layer being provided at a level higher than an upper surface of the passive element, and the upper surface of the first heat conduction layer being at a substantially same level with an upper surface of the second heat conduction layer, wherein the second semiconductor package includes a second substrate, a second semiconductor chip, and a second molding layer, the substrate is spaced apart from the second substrate, the upper surface of the first heat conduction layer is at a substantially same level with a lower surface of the heat dissipation structure, and the second semiconductor chip is a different type of semiconductor chip than the first semiconductor chip.

19. The semiconductor package system of claim 18, further comprising:

a third semiconductor package on the substrate; and a third heat conduction layer on the third semiconductor package, wherein the third heat conduction layer is in physical contact with the heat dissipation structure, and the thickness of the first heat conduction layer is smaller than a thickness of the third heat conduction layer.

20. The semiconductor package system of claim 12, further comprising:

a ground pattern on an upper surface of the substrate; and a conductive adhesive pattern between the ground pattern and the heat dissipation structure, wherein the heat dissipation structure includes a body portion and a leg portion, the body portion extends in parallel to the upper surface of the substrate, the leg portion is connected to the body portion, the leg portion is between the substrate and the body portion, and the heat dissipation structure is electrically connected to the ground pattern through the conductive adhesive pattern.

* * * * *